US009758876B2

(12) United States Patent  
Shorey et al.

(10) Patent No.: US 9,758,876 B2
(45) Date of Patent: Sep. 12, 2017

(54) SACRIFICIAL COVER LAYERS FOR LASER DRILLING SUBSTRATES AND METHODS THEREOF

(71) Applicant: Corning Incorporated, Corning, NY (US)

(72) Inventors: Aric Bruce Shorey, Webster, NY (US); Garrett Andrew Piech, Corning, NY (US); Xinghua Li, Horseheads, NY (US); John Christopher Thomas, Elmira, NY (US); John Tyler Keech, Painted Post, NY (US); Jeffrey John Domey, Elmira, NY (US); Paul John Shustack, Elmira, NY (US)

(73) Assignee: CORNING INCORPORATED, Corning, NY (US)

( * ) Notice: Subject to any disclaimer, the term of this patent is extended or adjusted under 35 U.S.C. 154(b) by 149 days.

(21) Appl. No.: 14/092,536

(22) Filed: Nov. 27, 2013

(65) Prior Publication Data

US 2014/0147623 A1 May 29, 2014

Related U.S. Application Data

(60) Provisional application No. 61/730,994, filed on Nov. 29, 2012, provisional application No. 61/815,864, (Continued)

(51) Int. Cl.
*H01L 21/302* (2006.01)
*H01L 21/461* (2006.01)
(Continued)

(52) U.S. Cl.
CPC ............ *C23F 4/04* (2013.01); *B23K 26/0622* (2015.10); *B23K 26/18* (2013.01); *B23K 26/386* (2013.01);
(Continued)

(58) Field of Classification Search
None
See application file for complete search history.

(56) References Cited

U.S. PATENT DOCUMENTS 4,948,941 A * 8/1990 Altman ................. B23K 26/18
219/121.71
5,493,096 A 2/1996 Koh
(Continued)

FOREIGN PATENT DOCUMENTS

CN 101427427 A 5/2009
CN 102319960 A 1/2012
(Continued)

OTHER PUBLICATIONS

Tom Christiansen, Tami Erickson; Standard Operating Procedure: Spin-on-Glass, Surface Level Characterization (2000).*
(Continued)

*Primary Examiner* — Stephanie Duclair
(74) *Attorney, Agent, or Firm* — John T. Haran

(57) ABSTRACT

A method for forming a plurality of precision holes in a substrate by drilling, including affixing a sacrificial cover layer to a surface of the substrate, positioning a laser beam in a predetermined location relative to the substrate and corresponding to a desired location of one of the plurality of precision holes, forming a through hole in the sacrificial cover layer by repeatedly pulsing a laser beam at the predetermined location, and pulsing the laser beam into the through hole formed in the sacrificial cover layer. A work piece having precision holes including a substrate having the precision holes formed therein, wherein a longitudinal axis of each precision hole extends in a thickness direction of the substrate, and a sacrificial cover layer detachably affixed to a surface of the substrate, such that the sacrificial cover layer reduces irregularities of the precision holes.

14 Claims, 30 Drawing Sheets

Related U.S. Application Data filed on Apr. 25, 2013, provisional application No. 61/817,444, filed on Apr. 30, 2013.

(51) Int. Cl.

| | | |
|---|---|---|
| *B23P 15/00* | (2006.01) | |
| *C03C 25/00* | (2006.01) | |
| *C23F 1/00* | (2006.01) | |
| *B44C 1/22* | (2006.01) | |
| *C03C 15/00* | (2006.01) | |
| *C23F 4/04* | (2006.01) | |
| *C03B 33/10* | (2006.01) | |
| *H05K 3/00* | (2006.01) | |
| *C03B 33/02* | (2006.01) | |
| *B23K 26/18* | (2006.01) | |
| *B23K 26/0622* | (2014.01) | |
| *B23K 26/386* | (2014.01) | |
| *B23K 26/40* | (2014.01) | |
| *B23K 26/382* | (2014.01) | |
| *B23K 103/00* | (2006.01) | |

(52) U.S. Cl.
CPC ............ *B23K 26/389* (2015.10); *B23K 26/40* (2013.01); *C03B 33/0222* (2013.01); *C03B 33/102* (2013.01); *H05K 3/0026* (2013.01); *B23K 2203/50* (2015.10); *B23K 2203/54* (2015.10); *Y10T 428/24322* (2015.01)

(56) References Cited

U.S. PATENT DOCUMENTS

| | | | |
|---|---|---|---|
| 6,120,131 A * | 9/2000 | Murthy | B41J 2/162 347/47 |
| 6,143,382 A | 11/2000 | Koyama et al. | |
| 6,754,429 B2 | 6/2004 | Borrelli et al. | |
| 7,033,519 B2 | 4/2006 | Taylor et al. | |
| 7,057,135 B2 | 6/2006 | Li | |
| 7,836,727 B2 | 11/2010 | Nishiyama | |
| 8,307,672 B2 | 11/2012 | Hidaka et al. | |
| 8,327,666 B2 | 12/2012 | Harvey et al. | |
| 8,341,976 B2 | 1/2013 | Dejneka et al. | |
| 2002/0005805 A1* | 1/2002 | Ogura | C03C 17/28 343/700 R |
| 2004/0188393 A1 | 9/2004 | Li | |
| 2005/0029238 A1 | 2/2005 | Chen | |
| 2006/0207976 A1 | 9/2006 | Bovatsek et al. | |
| 2008/0314883 A1 | 12/2008 | Juodkazis et al. | |
| 2010/0000259 A1 | 1/2010 | Ukrainczyk et al. | |
| 2010/0050692 A1 | 3/2010 | Logunov | |
| 2010/0080961 A1 | 4/2010 | Okamura et al. | |
| 2010/0119846 A1 | 5/2010 | Sawada | |
| 2010/0206008 A1 | 8/2010 | Harvey et al. | |
| 2010/0289186 A1 | 11/2010 | Longo et al. | |
| 2011/0003619 A1 | 1/2011 | Fujii | |
| 2011/0187025 A1 | 8/2011 | Costin, Sr. | |
| 2011/0256344 A1 | 10/2011 | Ono et al. | |
| 2011/0300908 A1 | 12/2011 | Grespan | |
| 2012/0013196 A1 | 1/2012 | Kim et al. | |
| 2012/0048604 A1 | 3/2012 | Cornejo | |
| 2012/0135177 A1 | 5/2012 | Comejo et al. | |
| 2012/0196071 A1* | 8/2012 | Cornejo | B28D 1/00 428/43 |
| 2012/0261697 A1 | 10/2012 | Margalit et al. | |
| 2013/0209731 A1 | 8/2013 | Nattermann et al. | |
| 2013/0247615 A1 | 9/2013 | Boek et al. | |
| 2014/0116091 A1 | 5/2014 | Chuang et al. | |

FOREIGN PATENT DOCUMENTS

| | | |
|---|---|---|
| CN | 102485405 A | 6/2012 |
| DE | 102010003817 A1 | 10/2011 |
| EP | 1164113 A1 | 12/2001 |
| EP | 1714730 A1 | 10/2006 |
| EP | 1990125 A1 | 11/2008 |
| EP | 2020273 A1 | 2/2009 |
| EP | 2253414 A1 | 11/2010 |
| JP | H03252384 A | 11/1991 |
| JP | 4349132 A | 12/1992 |
| JP | 2000301372 A | 10/2000 |
| JP | 2002-028799 * | 1/2002 |
| JP | 2002028799 A | 1/2002 |
| JP | 2011143434 A | 7/2011 |
| KR | 20110046953 A | 5/2011 |
| WO | 0133621 A2 | 5/2001 |
| WO | 2011109648 A1 | 9/2011 |
| WO | 2012075072 A2 | 6/2012 |

OTHER PUBLICATIONS

Madehow.com, Liquid Crystal Display (LCD), Jan. 29, 2006, https://web.archive.org/web/20060129092154/http:// www.madehow.com/Volume-1/Liquid-Crystal-Display-LCD.html; pp. 1-6.

Non-Final Office Action dated Aug. 3, 2015 relating to U.S. Appl. No. 14/092,544, filed Nov. 27, 2013.

International Search Report and Written Opinion filed in PCT/US2013/072345 mailed on May 14, 2014.

Final Office Action dated Jun. 15, 2015 relating to U.S. Appl. No. 13/800,033, filed Mar. 13, 2013.

International Preliminary Report on Patentability dated Jun. 11, 2015 relating to PCT/US2013/072346 filed Nov. 27, 2013.

International Preliminary Report on Patentability dated Jun. 11, 2015 relating to PCT/US2013/072342 filed Nov. 27, 2013.

International Search Report and Written Opinion, Application No. PCT/US2013/072342 filed Nov. 27, 2013, mailed Feb. 7, 2014.

International Search Report and Written Opinion, Application No. PCT/US2013/035195 filed Apr. 4, 2013, mailed Apr. 9, 2014.

Mukhina L., Laser Pulse Damage on the Surface of Ion Exchange Treated Glass, Soviet Journal of Glass physics and Chemistry, vol. 19, No. 3, pp. 269-272, Jun. 1, 1993.

Chinese First Office Action CN201380071736.1 Dated Jul. 26, 2016.

Koyama et al. "Laser-micromachining for Ag Ion Exchanged Glasses," Second International Symposium on Laser Precision Microfabrication, Proc. SPE vol. 4426 (2002) 162-165.

Kruger et al. "UV laser drilling of SiC for semiconductor device fabrication," J. Physics:Conference Series 59(2007) 740-744.

Li et al. "Thick Polymer cover layers for laser micromachining of fine holes," Applied Physics A, Sep. 2005, vol. 81, Issues 4, pp. 753-758.

Matsusaka et al. "Micro-machinability of silver-sodium ion-exchanged glass by UV nanosecond laser," J. Materials Processing Technology 202 (2008) 514-520.

Tsai et al. "Investigation of underwater laser drilling for brittle substrates," J. Materials Processing technology 209 (2009) 2838-2846.

Wlodarczyk et al. "The Impact of Graphite Coating and Wavelength on Picosecond Laser Machining of Optical Glasses," , 31st ICALEO Program Notes (2012). Paper M#309.

English Translation of Chinese First Office Action CN201380071736.1 dated Mar. 7, 2017.

\* cited by examiner

SACRIFICIAL COVER LAYERS FOR LASER DRILLING SUBSTRATES AND METHODS THEREOF

CROSS-REFERENCE TO RELATED APPLICATIONS

This application claims priority to U.S. Provisional Patent Application No. 61/730,994, filed Nov. 29, 2012; U.S. Provisional Patent Application No. 61/815,864, filed Apr. 25, 2013; and U.S. Provisional Patent Application No. 61/817,444, filed Apr. 30, 2013. The entireties of these provisional applications are incorporated herein by reference.

BACKGROUND

Field

The present specification generally relates to the manufacture of thin substrates with formed holes and, more specifically, to methods for laser drilling thin substrates using a sacrificial cover layer, and a work piece used to form holes in a substrate and a sacrificial cover layer.

Technical Background

Holes may be formed in glass articles by methods such as laser machining, photo machining, direct molding, electrical discharge machining, and plasma/reactive etching. Such glass articles may be used in a number of electrical devices such as interposers that route electrical signals between silicon microchips and organic substrates. Further, the glass articles may be used in life science applications, such as in digital polymerase chain reaction (dPCR) instruments.

In the laser drilling method, pulses of a UV laser are directed to a glass article in predetermined positions to thereby form holes in the glass article at the predetermined positions. The number of pulses applied at each predetermined positioned may be determined based on the desired depth of the hole in the glass article. The diameters of the holes formed by laser drilling may be modified using an optional etching process. In the etching process, an etching solution is applied to the surface of the glass article, such as by spraying or immersion, after the holes have been drilled into the glass article by the laser. The duration of exposure, temperature, concentration, and chemistry of the etching solution may be determined based upon the desired diameters of the holes in the glass article.

Laser drilling holes directly into a glass article may cause defects, such as micro-cracks or "checks," at the entrance hole where the laser is incident on the glass article. Optimizing the laser exposure conditions, such as beam quality, beam focus, pulse rate, and pulse energy can reduce the number of defects in the entrance holes. However, currently available methods are not able to produce small-diameter holes with an acceptably low amount of defects, particularly when small-diameter holes are spaced relatively far apart. In this situation, the entrance holes may crack more easily, and even the slightest irregularity in roundness may be magnified during etching leading to a glass article with holes that have unacceptable roundness.

Accordingly, a need exists for alternative methods for forming holes in glass articles, such as thin glass, that do not result in cracking at the entrance holes where the laser is incident on the glass article.

SUMMARY

In a first aspect, a method for forming a plurality of precision holes in a substrate by drilling is disclosed. The method includes: affixing a sacrificial cover layer to a surface of the substrate; positioning a laser beam in a predetermined location relative to the substrate and corresponding to a desired location of one of the plurality of precision holes; forming a through hole in the sacrificial cover layer by repeatedly pulsing the laser beam at the predetermined location; and pulsing the laser beam into the through hole formed in the sacrificial cover layer at the predetermined location thereby creating the one of the plurality of precision holes, wherein a number of pulses applied to the substrate is determined by a desired depth of the one of the plurality of precision holes.

A second aspect includes the method of the first aspect, wherein the sacrificial cover layer is removed after the plurality of precision holes is formed in the substrate.

A third aspect includes the method of any of the preceding aspects, further comprising etching the substrate after removing the sacrificial cover layer.

A fourth aspect includes the method of the first and second aspects, further comprising etching the substrate after the plurality of precision holes has been created in the substrate.

A fifth aspect includes the method of any of the preceding aspects, wherein the laser beam has a wavelength of about 355 nm, a pulse duration between about 10 nanoseconds and about 50 nanoseconds, a repetition rate between about 1 kHz and about 150 kHz, and a numerical aperture between about 0.02 and about 0.4.

A sixth aspect includes the method of any of the preceding aspects, further comprising applying an electrically conductive material to one or more precision holes of the plurality of precision holes.

A seventh aspect includes the method of any of the preceding aspects, wherein an interface between the sacrificial cover layer and the surface of the substrate is substantially free of air gaps.

An eighth aspect includes the method of any of the preceding aspects, further comprising cleaning the substrate and the sacrificial cover layer before the affixing step.

A ninth aspect includes the method of any of the preceding aspects, wherein the sacrificial cover layer and the substrate are affixed by direct, physical contact.

A tenth aspect includes the method of any of the preceding aspects, further comprising applying a fluid to at least one of the sacrificial glass cover layer and the surface of the substrate before attaching the sacrificial glass cover layer to the surface of the substrate.

An eleventh aspect includes the method of any of the preceding aspects, wherein the sacrificial cover layer is made of glass.

A twelfth aspect includes the method of the eleventh aspect, wherein the sacrificial cover layer has a thickness from about 50 μm to about 500 μm.

A thirteenth aspect includes the method of the first through tenth aspects, wherein the sacrificial cover layer is made of a polymer.

A fourteenth aspect includes the method of the thirteenth aspect, wherein the sacrificial cover layer is affixed to the surface of the substrate by applying a liquid polymer material to the surface of the substrate.

A fifteenth aspect includes the method of the fourteenth aspect, further comprising curing the liquid polymer material.

A sixteenth aspect includes the method of the thirteenth through fifteenth aspects, wherein the sacrificial cover layer has a thickness less than about 100 μm.

A seventeenth aspect includes the method of the thirteenth aspect, wherein the sacrificial cover layer is affixed to the surface of the substrate by applying a polymer tape to the surface of the substrate.

An eighteenth aspect includes the method of the thirteenth through seventeenth aspects, further comprising removing the sacrificial cover layer from the surface of the substrate by applying a solvent to the sacrificial cover layer.

A nineteenth aspect includes the method of the first through twelfth aspects, wherein the sacrificial cover layer is affixed to the surface of the substrate by Van der Waals attraction.

A twentieth aspect includes the method of the nineteenth aspect, wherein a bonding energy provided by the Van der Waals attraction is between about 30 $mJ/m^2$ to about 100 $mJ/m^2$.

A twenty-first aspect includes the method of any of the preceding aspects, wherein the sacrificial cover layer has a coefficient of thermal expansion that is different from a coefficient of thermal expansion of the substrate.

A twenty-second aspect includes the method of the nineteenth through twenty-first aspects, further comprising removing the sacrificial cover layer from the surface of the substrate by heating the sacrificial cover layer and the substrate such that the sacrificial cover layer separates from the substrate.

A twenty-third aspect includes the method of the nineteenth through twenty-second aspects, wherein the sacrificial cover layer has a thickness of from about 50 µm to about 500 µm.

A twenty-fourth aspect includes the method of first through ninth aspects, wherein the sacrificial cover layer comprises a thin pigment or dye-based ink.

A twenty-fifth aspect includes the method of the twenty-fourth aspect, wherein the sacrificial cover layer is affixed to the surface of the substrate by ink-jet printing, bubble jet-printing, spray coating, spin coating, or manual application.

A twenty-sixth aspect includes the method of the twenty-fourth and twenty-fifth aspects, wherein the sacrificial cover layer has a thickness of less than about 100 µm.

A twenty-seventh aspect includes the method of the twenty-fourth through twenty-sixth aspects, further comprising removing the sacrificial cover layer from the surface of the substrate by applying a solvent to the sacrificial cover layer.

A twenty-eighth aspect includes the method of any of the preceding aspects, further comprising, after affixing the sacrificial cover layer to the substrate, positioning the sacrificial cover layer and the substrate into a carrier ring.

A twenty-ninth aspect includes the method of the twenty-eighth aspect, wherein the substrate is bonded to the carrier ring by Van der Waals attraction.

A thirtieth aspect includes the method of the method of the twenty-eighth and twenty-ninth aspects, further comprising permanently bonding the substrate to the carrier ring.

A thirty-first aspect is directed to a work piece having precision holes. The work piece includes: a substrate having the precision holes formed therein, wherein a longitudinal axis of each precision hole extends in a thickness direction of the substrate; and a sacrificial cover layer detachably affixed to a surface of the substrate, such that the sacrificial cover layer reduces irregularities of the precision holes, wherein the sacrificial cover layer comprises though holes, each through hole having a longitudinal axis aligned with the longitudinal axis of a corresponding precision hole.

A thirty-second aspect includes a work piece of the thirty-first aspect, wherein the sacrificial cover layer comprises glass.

A thirty-third aspect includes a work piece of the thirty-first aspect, wherein the sacrificial cover layer comprises a polymer.

A thirty-fourth aspect includes a work piece of the thirty-first and thirty-second aspect, wherein the sacrificial cover layer is affixed to the substrate by Van der Waals attractions.

A thirty-fifth aspect includes the work piece of the thirty-first aspect, wherein the sacrificial cover layer comprises a thin pigment or a dye-based ink.

A thirty-sixth aspect includes the work piece of the thirty-first through thirty-fifth aspects, wherein surface of the substrate is free from laser-induced micro-cracks that extend more than 5 µm from the one of the plurality of precision holes.

A thirty-seventh aspect includes the work piece of the thirty-first through thirty-fifth aspects, wherein an average entrance diameter of individual ones of the plurality of precision holes at the surface of the glass article after the pulsing of the laser beam is from about 10 µm to about 20 µm, and an average bottom diameter of individual ones of the plurality of precision holes at a position opposite to the surface in a longitudinal direction after the pulsing of the laser beam is from about 5 µm to about 10 µm.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1A:
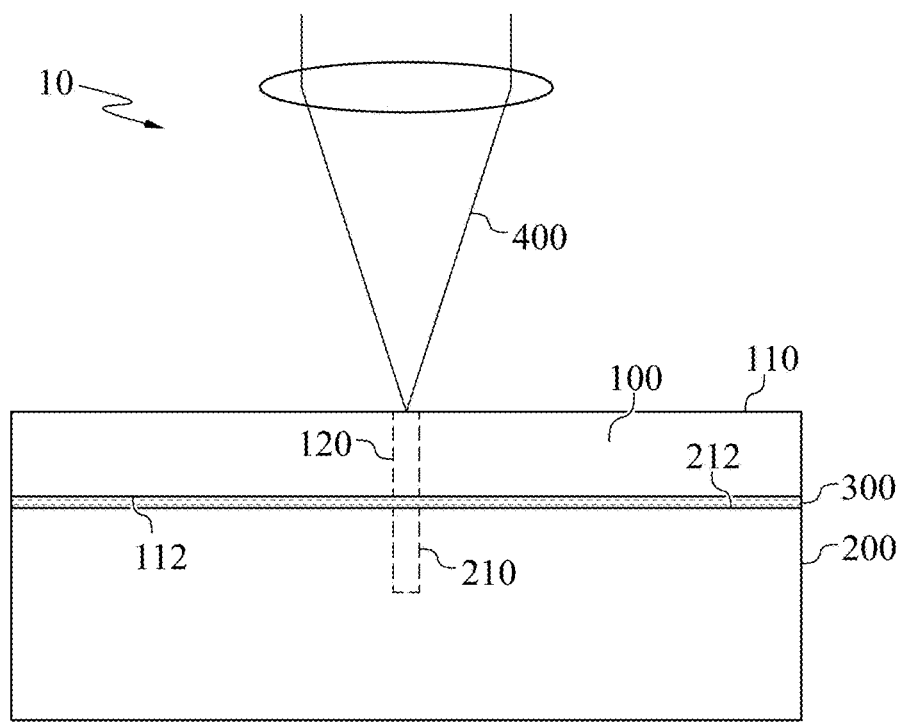
FIG. 1A schematically depicts a side view of components used in a laser drilling method using a sacrificial glass cover layer according to one or more embodiments shown and described herein.

Reference will now be made in detail to embodiments of the present disclosure, examples of which are illustrated in the accompanying drawings. Whenever possible, the same reference numerals will be used throughout the drawings to refer to the same or like parts. One embodiment of components used in the method of the present disclosure is shown in FIG. 1A, and is designated generally throughout by the reference numeral 10. The components generally may include a sacrificial cover layer made of glass or a polymer material that is detachably attached to a surface of a substrate, such as a glass article. A laser beam may be directed to a predetermined location on a surface of the sacrificial cover layer, and the laser beam may form a through hole in the sacrificial cover layer at the predetermined position. The laser beam may then be directed through the open hole formed in the sacrificial cover layer and may form precision holes in the glass article. The sacrificial cover layer may then be detached from the glass article. As described in detail below, the sacrificial cover layer prevents laser-induced micro-cracks and defects from forming around the precision holes, thereby improving circularity of the precision holes following an etching process.

Referring now to FIG. 1A, components used in a laser drilling method 10 for performing a laser drilling method according to embodiments is described herein. The components of the laser drilling method 10 generally include a substrate, such as a glass article 200, sacrificial cover layer in the form of, for example, a sacrificial cover layer 100, and a laser beam 400. Sacrificial cover layers in the form of a polymer material are described below with reference to FIGS. 4, 6A, 6B, and 19-25, and sacrificial cover layers in the form of pigments and dye-based inks are described below with reference to FIGS. 7A, 7B, and 27A-29B.

In the embodiment shown in FIG. 1A, the sacrificial cover layer 100 and the glass article 200 may be detachably attached. The composition and dimensions of the glass article 200 are not particularly limited, and are selected based on the desired end use of the glass article 200. The glass article may be, for example, Eagle XG glass, or Code 2318 glass, manufactured by Corning, Inc. or the like. Additionally, the glass article 200 may be in the shape of a wafer having a 4 inch, 6 inch, 8 inch, or 12 inch diameter. Alternatively, the glass article 200 may be in the form of a sheet having any dimensions suitable for its end use. The thickness of the glass article may also vary depending on its end use. For example, the glass article may have a thickness of from about 30 µm to about 1000 µm, from about 50 µm to about 700 µm, from about 150 µm to about 600 µm, or about 300 µm. Although FIG. 1A depicts a rectangular glass article, it is to be understood that any shape and size of glass article may be used with the method disclosed herein.

The composition of the sacrificial cover layer 100 may be any composition that is susceptible to laser drilling. Accordingly, the composition of the sacrificial cover layer 100 may be the same or different from the composition of the glass article 200. As an example and not a limitation, the sacrificial cover layer 100 may have the same composition and dimensions as the glass article 200. The thickness of the sacrificial cover layer 100 is not particularly limited. However, the number of laser pulses required to form a through hole in the sacrificial cover layer 100 increases as the thickness of the sacrificial cover layer 100 increases, thus a thick sacrificial cover layer increases process time. Also, if the sacrificial cover layer 100 is too thin, detachment of the sacrificial cover layer 100 may be difficult without the sacrificial cover layer fragmenting into many pieces. Exemplary thicknesses of the sacrificial cover layer 100 may be from about 30 µm to about 700 µm, such as from about 50 µm to about 500 µm, from about 150 µm to about 400 µm, or about 300 µm. The thickness of the sacrificial cover layer may vary depending on the composition of the sacrificial cover layer. The sacrificial cover layer 100 may have any dimensions provided that it covers the glass article in locations where holes are to be formed. Accordingly, the sacrificial cover layer 100 may have the same dimensions as the glass article 200.

The glass article 200 may be detachably attached to the sacrificial cover layer 100 through direct, physical contact, or by attachment with a fluid. In some embodiments, where the sacrificial cover layer 100 is detachably coupled to the glass article 200 through direct, physical contact, a surface 112 of the sacrificial cover layer 100 may be molecularly bonded to a surface 212 of the glass article 200 by ionic bonding, covalent bonding, and/or Van der Waals attraction forces. Molecularly bonding the sacrificial cover layer 100 to the glass article 200 may provide for a bond that is highly uniform, and may result in holes with higher quality (e.g., reduced chipping and holes having well-defined circularity) than other coupling methods.

In embodiments, both the surface 112 of the sacrificial cover layer 100 and the surface 212 of the glass article 200 may be smooth, have a low particle count, and be substantially free of organic or other materials. The bonding energy provided by the molecular bond, such as Van der Waals attraction forces, should be sufficient to maintain the sacrificial cover layer 100 and the glass article 200 in a coupled relationship throughout the laser drilling process. As an example and not a limitation, the bonding energy may be between about 30 mJ/m$^2$ and about 100 mJ/m$^2$ to maintain the sacrificial cover layer 100 and the glass article 200 in a coupled relationship during the laser drilling process. The surfaces 112, 212 may have a smoothness to allow for molecular bonding to be maintained throughout the laser drilling process. As an example and not a limitation, the surface 112 of the sacrificial cover layer 100 and the surface 212 of the glass article 200 may have a surface smoothness found in fusion-drawn glass substrates, such as Corning EAGLE XG®. It should be understood that other glass substrates may be utilized.

The surfaces of the sacrificial cover layer 100 and the glass article 200 may be cleaned before they are attached to one another to minimize any gap(s) between the sacrificial cover layer 100 and the glass article 200. In embodiments, the surfaces 112, 212 should be substantially free of particles about 1 µm in diameter or larger. Any known or yet-to-be-developed cleaning processes may be used. Non-limiting cleaning processes include RCA Standard Clean 1 ("SC1"), RCA Standard Clean 2 ("SC2"), SC1 plus SC2, and dilute HF, which are typically used in the semiconductor industry.

As stated above, attachment between the sacrificial cover layer 100 and the glass article 200 may be provided by fluid attachment. Exemplary fluid attachment may include applying a thin layer of water or oil to one or both of the glass article 200 and the sacrificial cover layer 100, and attaching the glass article 200 to the sacrificial cover layer 100 by Van der Waals interactions. Oils used to attach the glass article 200 and the sacrificial cover layer 100 to one another are not particularly limited and may include optical index matching fluid from Cargille Laboratories, vegetable oil, canola oil, peanut oil, or the like.

Referring again to FIG. 1A, a gap 300 may be present between the sacrificial cover layer 100 and the glass article 200. It should be understood that the thickness of the gap 300 in FIG. 1A is exaggerated for illustrative purposes, and that the thickness of the gap 300, if present, is not limited by the gap 300 depicted in FIG. 1A. The gap may be thin, such as less than 50 um, or even less than 10 um, such as less than 1 um. The gap 300 may be an air gap formed when the glass article 200 and the sacrificial cover layer 100 are attached by direct, physical contact. In embodiments where the sacrificial cover layer 100 is molecularly bonded to the glass article 200, there may be substantially no gap 300 present. Alternatively, the gap 300 may be filled with oil or other fluids that provide attachment when the glass article 200 and the sacrificial cover layer 100 are attached via fluid attachment.

Figure 2A:
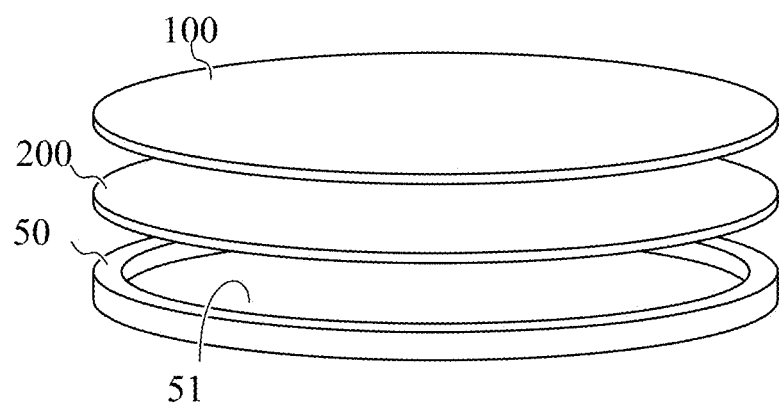
FIG. 2A schematically depicts an exploded, perspective view of a sacrificial cover layer, a glass article, and a carrier ring according to one or more embodiments shown and described herein.
Figure 2B:
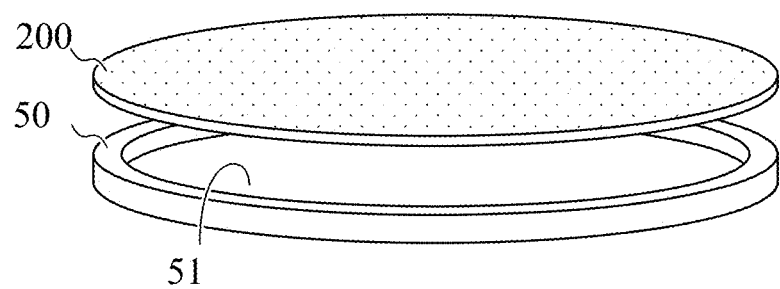
FIG. 2B schematically depicts an exploded, perspective view of a laser processed glass article and a carrier ring according to one or more embodiments shown and described herein.

Referring now to FIGS. 2A and 2B, in some embodiments, the coupled sacrificial cover layer 100 and the glass article 200 may be attached to, or disposed in, a carrier ring 50 to provide enhanced support around the perimeter of the glass article 200 (and sacrificial cover layer 100) before, during, and after laser through-hole processing. FIG. 2A depicts an exploded view of the sacrificial cover layer 100, the glass article 200, and the carrier ring 50, while FIG. 2B depicts an exploded view of the glass article 200 and the carrier ring 50 after laser processing and removal of the sacrificial cover layer 100. The carrier ring 50 may provide additional rigidity during laser drilling, via-filling, testing, and shipping.

Generally, the carrier ring 50, which may be made of glass, for example, comprises an annulus defining an opening 51. The opening 51 provides access to both surfaces of the glass article 200 during laser processing as well as during subsequent processing steps (e.g., etching). The opening 51 also provides access to both surfaces of the glass article 200 during testing of the glass article 200 after the metallization process (i.e., the process of filling vias with electrically conductive material). The thickness of the carrier ring 50 should be such that it provides sufficient rigidity to the work piece defined by the sacrificial cover layer 100 and the glass article 200. In one non-limiting example, the carrier ring 50 has a thickness of about 0.7 mm. It should be understood that other carrier ring thicknesses may be utilized.

The glass article 200 may be attached to the carrier ring 50 by any appropriate means. In embodiments, the glass article 200 may be adhered to the carrier ring 50 by an adhesive, or by Van der Waals attraction as described above. In some embodiments, it may be desirable to provide a permanent bond between the carrier ring 50 and the glass article 200. For example, the glass article 200 may be removably coupled to the carrier ring 50 (e.g., by Van der Waals attraction) and then heated to a temperature capable of permanently bonding the glass article 200 to the carrier ring 50. As an example and not a limitation, the carrier ring 50 may be separated from the glass article 200 during a subsequent separation process.

Particularly in the case of thin glass articles (e.g., less than 100 μm), the carrier ring 50 may provide for better glass article handling. As an example, the sacrificial cover layer 100 may be removed from the glass article 200 while the glass article 200 is still attached to the carrier ring 50 such that the glass article-carrier ring assembly may be shipped to a destination (e.g., a customer or subsequent fabrication processing location) for enhanced reliability during shipping. Further processing steps may be performed to the glass article 200 while attached to the carrier ring 50. As an example and not a limitation, electrically conductive material may be filled in the laser drilled through-holes to provide vias while the glass article 200 is still attached to the carrier ring 50.

Figure 2C:
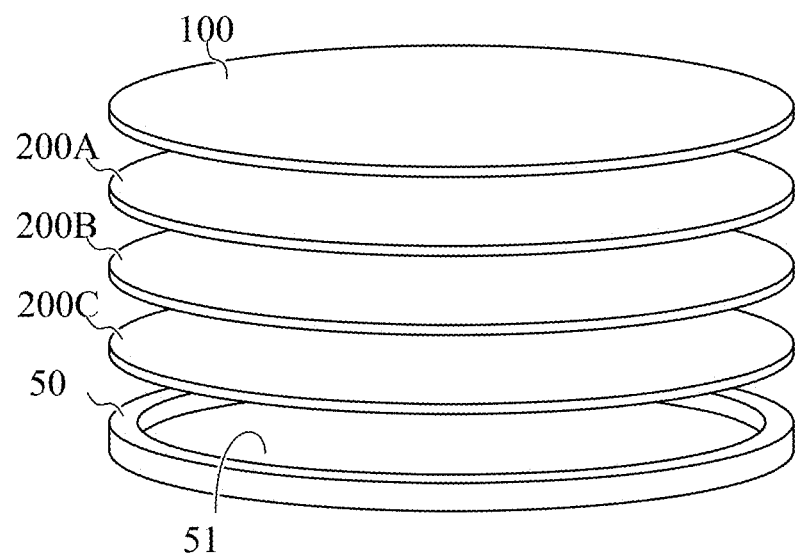
FIG. 2C schematically depicts an exploded, perspective view of a sacrificial cover layer, a plurality of stacked glass articles, and a carrier ring according to one or more embodiments shown and described herein.

Referring now to FIG. 2C, several thin glass articles 200A, 200B, and 200C (or substrates) may be bonded together in a stacked, layered arrangement to increase throughput and reduce the cost of manufacturing by laser processing more than one glass article at a time. FIG. 2C schematically depicts an exploded view of a sacrificial cover layer 100 attached to a stack of three glass articles 200A-200C that is attached to a carrier ring 50. The stacked (i.e., layered) glass articles 200A-200C may be bonded by the methods described above (e.g., fluid attachment, molecular bonding by Van der Waals attraction forces, and the like). It should be understood that more or fewer than three stacked glass articles 200A-200C may be provided. It should be understood that several glass articles may be arranged in a layered configuration without the use of a carrier ring 50 in embodiments. As stated above, the sacrificial cover layer 100 and the glass articles 200A-200C may be configured as the same part (i.e., they may have the same composition and dimensions).

The desired location or pattern of holes to be formed in the glass article 200 may be determined before forming the holes based on the desired use of the glass article. Referring to FIG. 1A, a laser beam 400 may be positioned incident to a top surface 110 of the sacrificial cover layer 100. The laser beam 400 may be positioned in a location on the top surface of the sacrificial cover layer 100 that corresponds to a predetermined location of a hole in the glass article 200.

The laser beam 400 may be any laser beam having optical properties capable of drilling the sacrificial cover layer 100 and the glass article 200. In one embodiment, the laser beam 400 may be an ultra-violet (UV) laser beam that is a frequency tripled neodymium doped yttrium orthovanadate (Nd:YVO$_4$) laser, which emits a wavelength of about 355 nm. The laser beam may interact with the glass through a nonlinear absorption mechanism, vaporizing the glass material and creating a plasma that ejects material from the glass, thereby forming a hole. Although an Nd:YVO$_4$ laser is described above, it should be recognized that any laser that is capable of forming a through hole in the sacrificial cover layer may be used. The laser beam 400 incident on the sacrificial cover layer 100 may have a numerical aperture between 0.01 and 0.5, such as between 0.02 and 0.4, between 0.05 and 0.3, between 0.06 and 0.2, and preferably 0.07. The focus of the laser beam relative to the top surface of the sacrificial cover layer may be placed with about 200 μm of the top surface, such as within about 100 μm of the top surface, or within about 50 μm of the top surface.

Referring to FIG. 1A, the laser beam 400 may be pulsed at the predetermined location to form a through hole 120 in the sacrificial cover layer 100. The pulse duration may be from about 10 nanoseconds to about 40 nanoseconds, or from about 25 nanoseconds to about 35 nanoseconds, or about 30 nanoseconds. The repetition rate of the pulse may be between 1 kHz and 150 kHz, such as between 1 kHz and 75 kHz, or between 1 kHz and 15 kHz. The number of pulses required to form a through hole in the sacrificial cover layer 100 will vary depending on the thickness of the sacrificial cover layer 100. For many glass types, about 0.75 μm of hole depth is formed with each laser pulse. Therefore, about 400 pulses may be required to make a through hole in 300 μm thick glass, about 675 pulses may be required to make a through hole in 400 μm thick glass, and about 950 pulses may be required to make a through hole in 700 μm thick glass. The laser beam may be pulsed any number of times required to form a through hole in the sacrificial cover layer 100.

The laser beam 400 may be pulsed into the through hole 120 in the sacrificial cover layer, thereby exposing the glass article 200 to the laser beam at the predetermined location in which the through hole 120 in the sacrificial cover was formed. The laser beam 400 may be pulsed into the through hole any number of times to form a hole 210 in the glass article. Although FIG. 1A depicts a blind hole 210 (e.g., a hole that does not extend entirely through the glass article), it should be understood that the depth of the hole 210 in the glass article depends on the number of pulses applied to the glass article and is not limited. For example, the hole in the glass article 200 may be a through hole, or may be a blind hole having any desired depth.

Figure 1B:
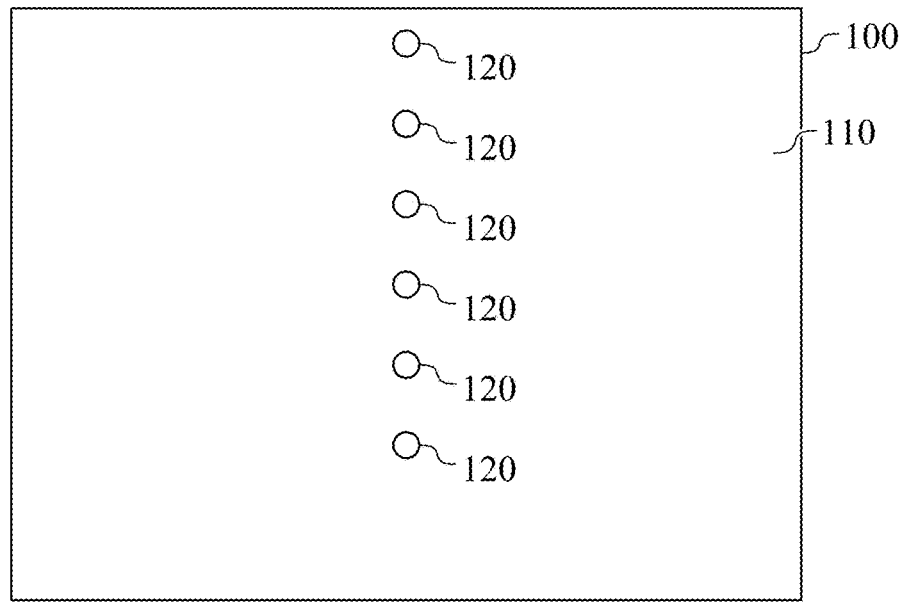
FIG. 1B schematically depicts a top view of a glass article used in a laser drilling method using a sacrificial glass cover layer according to one or more embodiments shown and described herein.

FIG. 1B is a top view of a sacrificial cover layer 100 in which multiple precision holes have been drilled, before the sacrificial cover layer has been removed from the glass article. Through holes 120 may be formed by pulsing a laser beam 400 (shown in FIG. 1A) to the surface 110 of the sacrificial cover layer 100. Through holes 120 may penetrate the sacrificial cover layer 100 and may have longitudinal axes that align with longitudinal axes of holes 210 formed in the glass article (shown in FIG. 1A).

In embodiments, multiple through holes in the sacrificial cover layer and multiple holes in the glass article may be made by the method described above. The laser may be positioned in one predetermined location and form the through hole in the sacrificial cover layer and the hole in the glass article at that predetermined position before the laser is placed in a different predetermined location. Alternatively, the laser may first form through holes in the sacrificial cover layer at multiple predetermined locations and, subsequently, return to the locations of the through holes in the sacrificial cover layer to form holes in the glass article.

The sacrificial cover layer may be removed after the holes in the glass article have been formed. The sacrificial cover layer may be removed by any suitable method, such as prying off or physically separating the sacrificial cover layer from the glass article, or applying a solvent to remove any fluid used to attach the sacrificial cover layer to the glass article.

Figure 3:
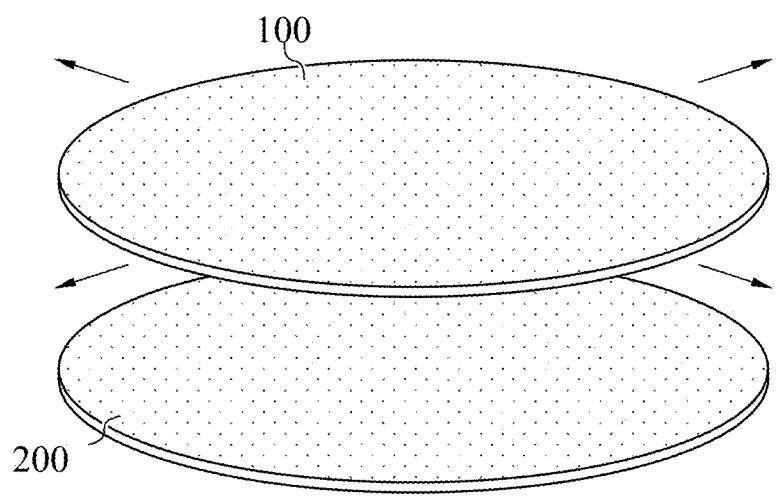
FIG. 3 schematically depicts an exploded, perspective view of a sacrificial cover layer having a coefficient of thermal expansion that is different from a coefficient of thermal expansion than a glass article according to one or more embodiments shown and described herein.

In some embodiments, the material for the sacrificial cover layer 100 may be chosen to have a coefficient of thermal expansion that is different from the coefficient of thermal expansion of the glass article 200. If the sacrificial cover layer 100 has a different coefficient of thermal expansion from the glass article 200, the two components will expand at different rates upon heating, which may aid in removing the sacrificial cover layer 100 without damage. Referring now to FIG. 3, the material chosen for the sacrificial cover layer 100 has a coefficient of thermal expansion that is greater than the coefficient of thermal expansion of the glass article 200. Separation of the sacrificial cover layers 100 described above. For example, in embodiments, the glass article 200 is aided by heating the sacrificial cover layer 100 and the glass article 200 such that the sacrificial cover layer 100 expands at a greater rate than the glass article 200. The sacrificial cover layer 100 may then be pulled away from the glass article 200.

Figure 4:
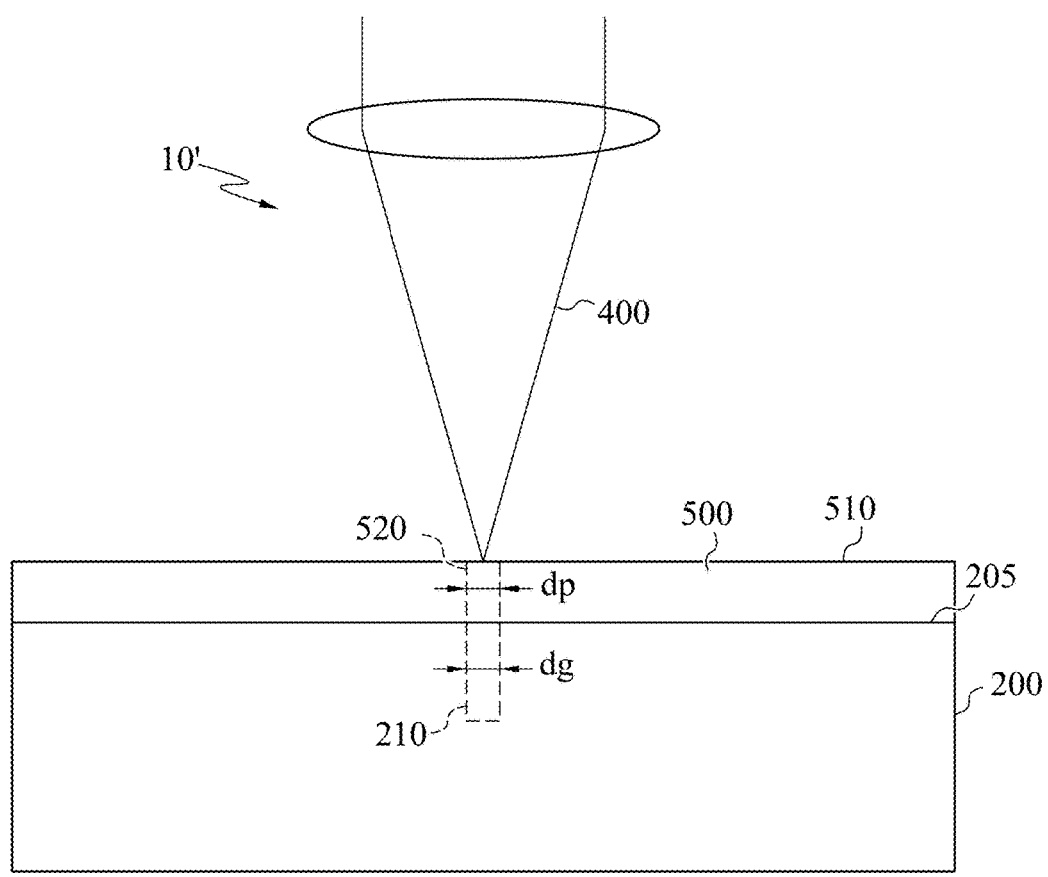
FIG. 4 schematically depicts a side view of components used in a laser drilling method using a sacrificial polymer cover layer.

In embodiments, the sacrificial cover layer may also be made of a polymer material rather than glass. Accordingly, a thin polymer coating or layer may be applied to a surface of the glass article. Referring now to FIG. 4, components used in a laser drilling method 10' for performing a laser drilling method according to sacrificial polymer cover layer embodiments is described herein. The components of the laser drilling method 10', which share similarity to the method 10 depicted in FIG. 1A and described above, generally include a glass article 200, sacrificial cover layer in the form of a sacrificial polymer cover layer 500, and a laser beam 400. The sacrificial cover layers 100 described hereinabove may be formed of any suitable material, such as, for example, glass, plastics, thermoplastics, elastomers, or the like. In some embodiments described hereinabove, the sacrificial cover layer may be a sacrificial glass cover layer 100.

Generally, the sacrificial polymer cover layer 500 may be thinner than the sacrificial glass cover layers 100 described above. For example, in embodiments, the sacrificial polymer cover layer 500 may be less than about 50 μm in thickness. Reduction in the thickness of the sacrificial cover layer may also reduce the drill time. Additionally, as the sacrificial polymer cover layer 500 may be applied to a surface of the glass article 200 in liquid form, air gaps between the glass article 200 and the sacrificial polymer cover layer 500 may be minimized or eliminated (i.e., substantially gap free). As described in more detail below, the sacrificial polymer cover layer 500 may be easily removed by solvents, a steaming process, peeling, and other methods.

The composition and dimensions of the glass article 200 may be as described above, are not particularly limited, and are selected based on the desired end use of the glass article 200. The glass article may be, for example, Eagle XG glass, or Code 2318 glass, manufactured by Corning, Inc. or the like. Additionally, the glass article 200 may be in the shape of a wafer having a 4 inch, 6 inch, 8 inch, or 12 inch diameter. Alternatively, the glass article 200 may be in the form of a sheet having any dimensions suitable for its end use. The thickness of the glass article may also vary depending on its end use. For example, the glass article may have a thickness of from about 30 μm to about 1000 μm, from about 50 μm to about 700 μm, from about 150 μm to about 600 μm, or about 300 μm. Although FIG. 4 depicts a rectangular glass article, it is to be understood that any shape and size of glass article may be used with the method disclosed herein.

The sacrificial polymer cover layer 500 is applied to a surface 205 of the glass article 200 such that the gap there between is minimized or eliminated. The sacrificial polymer cover layer 500 may be made of any material that allows for light guiding or confinement of the laser beam within the narrow channel that the laser beam ablates. The sacrificial polymer cover layer may be any material that may be applied to the surface 205 of the glass article substantially free from air gaps, may be ablated at the wavelength of the laser beam (e.g., 355 nm), and may be removed from the surface 205 of the glass article 200 without substantial residue. In some embodiments, the sacrificial polymer cover layer 500 has an index of refraction substantially equal to the index of refraction of the glass article 200. In other embodiments, the sacrificial polymer cover layer 500 has an index of refraction that is different from the index of refraction of the glass article 200.

In embodiments, the polymer material may be applied to the surface 205 of the glass article 200 in a liquid form, and then later cured (e.g., by UV curing, heat treatment, or drying). Application of the polymer material in liquid form may minimize or eliminate air gaps between the sacrificial polymer cover layer 500 and the glass article 200, for example. The liquid polymer material may be applied by any appropriate method including, but not limited to, screen printing, slot-coating, or spin-coating methods. Generally, the thickness uniformity of the sacrificial polymer cover layers 500 described herein is less than 10 μm. However, it should be understood that embodiments are not limited thereto.

In embodiments, UV-curable optical bonding agents may be used as the material for the sacrificial polymer cover layer 500. As an example and not a limitation, Lens Bond Type P-92 manufactured by Summers Optical of Hatfield, Pa. may be used as the sacrificial polymer cover layer 500. Other UV-curable polymer materials may be utilized, and the embodiments described herein are not limited to any particular polymer material formulation. It is noted that DSM 950-076 manufactured by DSM of Heerlen, the Netherlands was also evaluated and shown to be an effective polymer material to be used as the sacrificial polymer cover layer 500. The UV-curable material may be cured by exposure to UV light to form the sacrificial polymer cover layer 500 on the surface 205 of the glass article 200.

Other forms of polymer materials may also be utilized. For example, the sacrificial polymer cover layer 500 may be applied in the form of a polymer tape, film or laminate that is adhered to the surface 205 of the glass article 205. Without limitation, additional polymer materials may include Visqueen manufactured by British Polythene Industries, Ltd. of Greenock, Scotland, UK; ANT35 tape manufactured by Seil Hi-Tec Co. Ltd. of Chungbuk, South Korea; D-611H tape manufactured by Lintec Corporation of Tokyo, Japan; and SPV-AM-500 tape manufactured by Nitto Denko of Osaka, Japan. The above-referenced materials have been evaluated and have shown to suppress initial micro-cracks and chips in the entrance holes on the surface 205 of the tested glass articles 200. It should be understood that other materials may also be utilized. The entrance hole is the area of the laser-drilled hole that is at the surface 205 of the glass article 200.

Referring to FIG. 4, the laser beam 400 may be any laser beam having optical properties capable of drilling the sacrificial polymer cover layer 500 and the glass article 200. For example, the laser beam 400 may be configured as described above with respect to FIG. 1A and the sacrificial cover layer 100. As described above, the laser beam may interact with the polymer material and the glass through a nonlinear absorption mechanism, vaporizing the polymer material and then the glass material and creating a plasma that ejects material from the glass, thereby forming a hole. The laser beam 400 incident on the sacrificial polymer cover layer 500 may have a numerical aperture between 0.01 and 0.5, such as between 0.02 and 0.4, between 0.05 and 0.3, between 0.06 and 0.2, and preferably 0.07.

Similar to the laser drilling method 10 described above with reference to FIG. 1A, the laser beam 400 may be pulsed at the predetermined location to form a through hole 120 having a diameter $d_p$ in the sacrificial polymer cover layer 500. The pulse duration may be from about 10 nanoseconds to about 50 nanoseconds, or from about 25 nanoseconds to about 35 nanoseconds, or about 30 nanoseconds. The repetition rate of the pulse may be between 1 kHz and 150 kHz, such as between 1 kHz and 75 kHz, or between 1 kHz and 15 kHz. The number of pulses required to form a through hole in the sacrificial polymer cover layer 500 will vary depending on the thickness of the sacrificial polymer cover layer 500 and the type of material chosen. As an example and not a limitation, about 20 laser pulses are required to drill a 50 μm thick sacrificial polymer cover layer made of Lens Bond Type P92 using a 355 nm pulsed laser meeting the specifications above and at a pulse energy of 50-150 μJ.

The laser beam 400 may be pulsed into the through hole 520 in the sacrificial polymer cover layer 500, thereby exposing the glass article 200 to the laser beam at the predetermined location in which the through hole 120 in the sacrificial polymer cover layer 500 was formed. The laser beam 400 may be pulsed into the through hole any number of times to form a hole 210 having a diameter $d_g$ in the glass article. In embodiments, the diameter $d_p$ is substantially equal to the diameter $d_g$. In other embodiments, the diameter $d_p$ is greater than the diameter $d_g$. As an example and not a limitation, the diameter $d_p$ may be less than two times the diameter $d_g$. Although FIG. 4 depicts a blind hole 210 (e.g., a hole that does not extend entirely through the glass article 200), it should be understood that the depth of the hole 210 in the glass article 200 depends on the number of pulses applied to the glass article 200 and is not limited. For example, the hole 210 in the glass article 200 may be a through hole, or may be a blind hole having any desired depth.

The sacrificial polymer cover layer 500 may be removed from the glass article 200 before or after an etching process (described below) to etch the glass article 200 to further shape the laser drilled holes 210. The sacrificial polymer cover layer 500 may be removed by any appropriate means. For example, the sacrificial polymer cover layer 500 and the glass article may be placed in a hot water bath (e.g., about 80° C. to about 100° C. or other temperature and soaked for a period of time, or steamed in a closed container. The sacrificial polymer cover layer 500 may then be easily peeled from the surface 205 of the glass article 200. The sacrificial polymer cover layer 500 may also be removed by soaking the sacrificial polymer cover layer 500 and glass article 200 in a solvent, such as N-Methyl-2-pyrrolidone), which may facilitate the release of the sacrificial polymer cover layer 500 from the surface 205. In yet other embodiments, the sacrificial polymer cover layer 500 may be peeled from the surface 205 of the glass article 200 without application of solvents or steam.

In embodiments, the sacrificial cover layer may be a thin pigment or dye-based ink coating. Sacrificial cover layers comprising thin pigments or dye-based inks may be easily applied with methods, such as, ink-jet printing, bubble jet-printing, spray coating, spin coating, or manual application, such as with a brush or marker. Sacrificial cover layers comprising thin pigments or dye-based inks may also be applied as thin layers. In embodiments, the thickness of the thin pigment or dye-based ink sacrificial cover layer may be less than or equal to about 10 μm, such as less than or equal to about 8 μm. In other embodiments, the thickness of the thin pigment or dye-based ink sacrificial cover layer may be less than or equal to about 6 μm, such as less than or equal to about 5 μm. The thin pigment or dye-based ink is not particularly limited and any commercially available dye or ink may be used according to embodiments. For example, the thin pigment or dye-based ink may be paints, enamels, water-soluble dyes or pigments, oil-soluble dyes or pigments, wax-based dyes or pigments, or the like. In some embodiments, the thin pigment or dye-based ink may be CRAYOLA Tempura paints, EXPO dry-erase markers, SHARPIE permanent markers, CRAYOLA washable markers, CARTER permanent marker, KRYLON tough-coat acrylic enamel, photo-resist, or the like. Any coating or layer that changes the energy of the laser at the surface of the article may be utilized.

In embodiments using a thin pigment or dye-based ink, the laser drilling process may be the same, or substantially the same, as the laser drilling process described above when a sacrificial glass cover layer or a sacrificial polymer cover layer is used. For instance, in embodiments, a thin pigment or dye-based ink may be applied on one or more surfaces of a substrate, such as a glass article, for example (for example, in FIG. 1A, the thin pigment or dye-based ink sacrificial layer may take the place of the sacrificial layer 100). The laser may then be focused on the surface of the substrate on which the thin pigment or dye-based ink was applied. A through hole may be drilled into the thin pigment or dye-based ink sacrificial cover layer with the laser, such as by pulsing the laser as described in embodiments above. The laser drilling is continued through the through holes formed in the thin pigment or dye-based ink layer and onto a surface of the substrate, thereby forming through holes or blind holes in the substrate.

In embodiments, when the laser drilling is complete, the thin pigment or dye-based ink layer may be removed from the substrate by any suitable method. For example, in some embodiments the thin pigment or dye-based ink may be removed by placing the coated substrate in warm water, such as water from about 75° C. to about 110° C., such as from about 80° C. to about 100° C. In other embodiments, a solvent, such as, for example, isopropyl alcohol (IPA), was wiped across the surface of the substrate to remove the thin pigment or dye-based ink layer.

An etching process may be performed on the glass article after the sacrificial cover layer has been removed to further shape the laser drilled holes. The etching process is not particularly limited and may include acid etching. The etching solution may include at least one of hydrofluoric acid, nitric acid, and acetic acid. If a base solution is used, the solution may include one or more of KOH, $NH_4OH$, and tetramethyl ammonium hydroxide (TMAH). The solution may alternatively or additionally include an additive, such as isopropyl alcohol, hydrogen peroxide, or ozonated deionized water. In embodiments, the etching solution may include a mixture of hydrofluoric acid and nitric acid including from about 10% to about 30% HF and from about 5% to about 15% $HNO_3$, such as about 20% HF and about 10% $HNO_3$. Generally, the glass removal rate from the etchant may be from about 2 μm/min to about 20 μm/min, such as from about 3 μm/min to about 15 μm/min, or from about 5 μm/min to about 10 μm/min. The etching may be isotropic and may enlarge the diameter of the hole formed in the glass article as well as reduce the thickness of the glass article. The etching solution may be applied by an application process including, but not limited to, sprayed onto the glass article, or the glass article may be immersed in the etching solution. The duration of the etching process is not limited and may be determined based on the etch rate of the etching solution and the desired diameters of the holes in the glass article.

Figure 25:
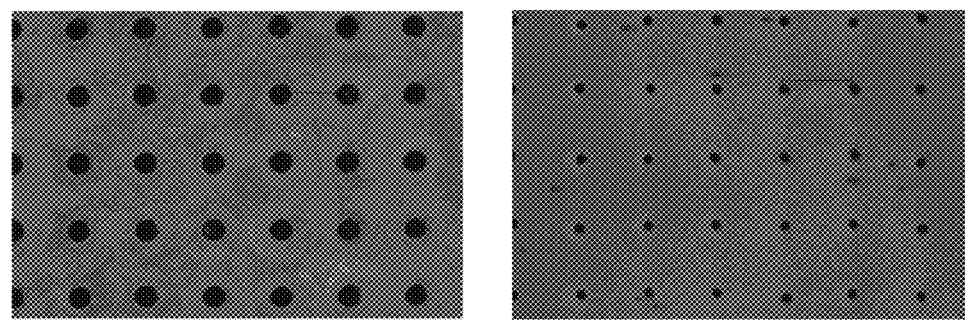
FIG. 25 shows top (left) and bottom (right) views of post-etch glass where a sacrificial polymer layer was left on the top surface during an etching process according to one or more embodiments shown and described herein.
Figure 26:
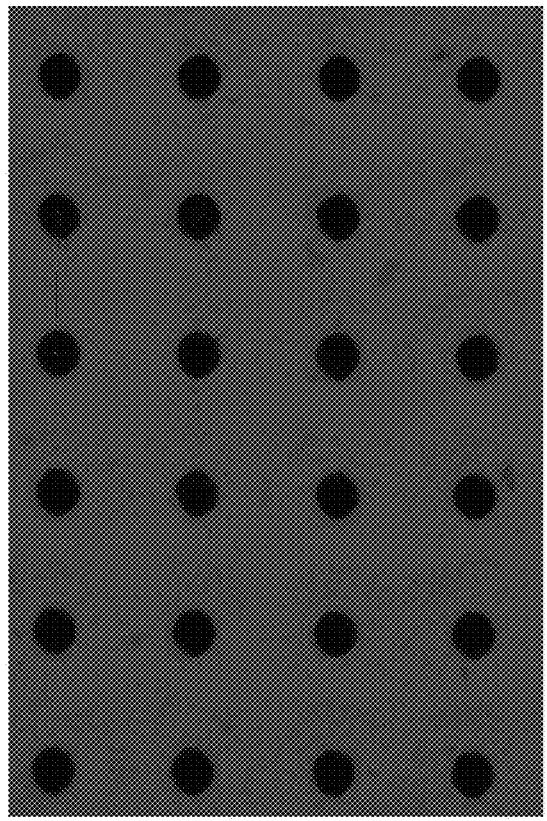
FIG. 26 shows top (left) and bottom (right) views of post-etch glass where a sacrificial polymer layer was left on the top surface during an etching process according to one or more embodiments shown and described herein.
Figure 26:
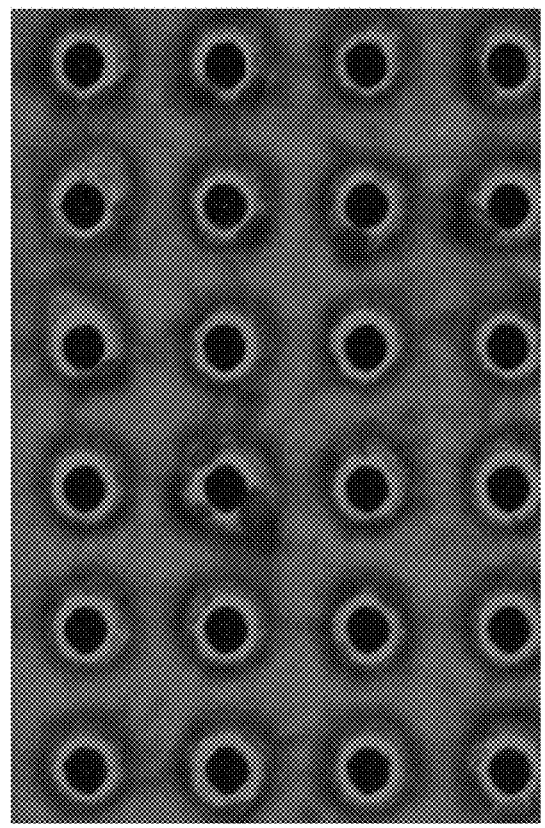

In some embodiments, the sacrificial polymer cover layer 500 may be removed after the etching process such that it acts as a mask protecting the surface 205 of the glass article 200 from etching. Accordingly, the sacrificial polymer cover layer 500 may reduce or eliminate the thinning of the glass article 200 during the etching process, while still allowing the etching process to enlarge the diameter of the holes to the desired dimensions. In embodiments, the polymer material selected for the sacrificial polymer cover layer 500 may be resistant to the etchant solution (e.g., HF). In other embodiments, the polymer material selected for the sacrificial polymer cover layer 500 may not be highly resistant to the etchant solution but may still provide masking functionality during the short etching duration. Accordingly, the polymer material may or may not be formulated to be resistant to the etchant solution. FIG. 25 depicts photographs of top (left) and bottom (right) surfaces of a glass article following the etching process with a Lens Bond Type P-92 sacrificial polymer cover layer left on then laser entry surface (i.e., top surface). The Lens Bond Type P-92 layer was removed prior to taking the photographs. Lens Bond Type P-92 is not highly resistant to HF but remained on the surface of the glass article after the etching process. FIG. 26 depicts photographs of top (left) and bottom (right) surfaces of a glass article following the etching process with a HF-resistant sacrificial polymer cover layer left on the laser entry surface.

The polymer material may also be applied to the second surface that is opposite from the laser entry surface 205 of the glass article 200 to mask both surfaces of the glass article 200 during the etchant process, thereby further preventing thinning of the glass article 200.

The glass articles with precision holes formed therein may be utilized as interposer devices to route electrical signals between microchips and organic substrates, to fan out electrical connections between dense-pitch chips and wider-pitch layers underneath, to connect multiple silicon chips in two or three dimensional packaging architectures and other applications. Accordingly, in some embodiments, the precision holes may be filled with an electrically conductive material during a metallization process to form electrically conductive vias within the precision holes. In embodiments, the sacrificial polymer cover layer 500 may be left on during the metallization process such that it may protect the glass article from handling damage, as well as act as a mask during the coating of the electrically conductive material. In this manner, the electrically conductive material may only be applied to the precision holes. This may reduce the cost of the interposer end product by obviating the need for an additional mask to be added during the metallization process.

The above-described method may be used to form holes of any size and with any pattern in the glass article. The method is not limited to any particular hole size or pattern. However, laser-induced cracking and asymmetries in glass articles is particularly problematic when the hole size is small and the spacing between the holes is large. Thus, the above method may be used in embodiments having small diameter holes with large spacing between the holes.

The circularity (i.e., roundness) of a hole formed in the glass article may be defined as the radial separation between the inscribing and circumscribing circles around the hole center, wherein the center is defined by the least squares fit of a circle to the measured hole profile. Regarding holes with small diameters, the required circularity of a hole may generally be a percentage of the hole diameter. Accordingly, an asymmetry in a small-diameter hole will represent a larger percentage than the same asymmetry in a large-diameter hole. As an example, a 5 μm asymmetry as measured by the radial separation between the inscribing and circumscribing circles around the hole center will be a larger fraction of a 30 μm diameter hole (about 33%) than the fraction of the same 5 μm asymmetry in a 100 μm diameter hole (about 10%). Therefore, the asymmetries in small-diameter holes should be kept to a minimum. Asymmetries in the holes may be caused by laser-induced micro-cracks that extend from the hole. For example, a 5 μm micro-crack that extends from the hole prior to etching may cause a 5 μm asymmetry following the etching process.

Regarding the spacing between holes, in laser drilled holes that are spaced closely together, for example less than 200 µm spacing, there is a reduction in the amount of asymmetries in the entrance holes as compared to holes with larger spacing, for example greater than 200 µm spacing.

Although not limited hereto, one theory why the sacrificial cover layer, whether made of glass or a polymer material, may improve roundness of small-diameter holes with spacing greater than 200 µm may be that the hole formed in the sacrificial cover layer acts as a light guide or lens, focusing the beam and improving beam quality as the laser beam is pulsed through the through hole in the sacrificial cover layer. Another non-limiting possibility is that thermally induced refractive index changes or electrorestrictive material effects may self-focus the laser beam. Even though the exact mechanism(s) from improved hole quality is fully explained for every sacrificial material, propagation of a laser beam through a through hole in a sacrificial cover layer creates a cleaner and improved hole substantially free from micro-cracks in the glass article compared to holes formed by the direct drilling method. Accordingly, by sending the laser beam through a small thickness of material before the laser beam interacts with the glass article of interest (i.e., the part being fabricated), it may be possible to use this focusing effect to create a high quality entrance hole in the glass. Although the method described herein may be used to form holes in a glass article described herein having any diameter and any spacing, the method may be used to form precision holes with spacing from about 200 µm to about 1000 µm, such as from about 200 µm to about 800 µm, from about 200 µm to about 600 µm, from about 250 µm to about 500 µm and from about 300 µm to about 400 µm.

Further, the method described herein may be used to form holes in the glass article with pre-etch entrance diameters at the surface of the glass article ranging from about 5 µm to about 25 µm, such as from about 15 µm to about 20 µm. Diameters at the bottom of the hole at a position opposite to the surface of the glass article in a longitudinal direction may range from about 2 µm to about 12 µm, such as from about 5 µm to about 10 µm.

Figure 5A:
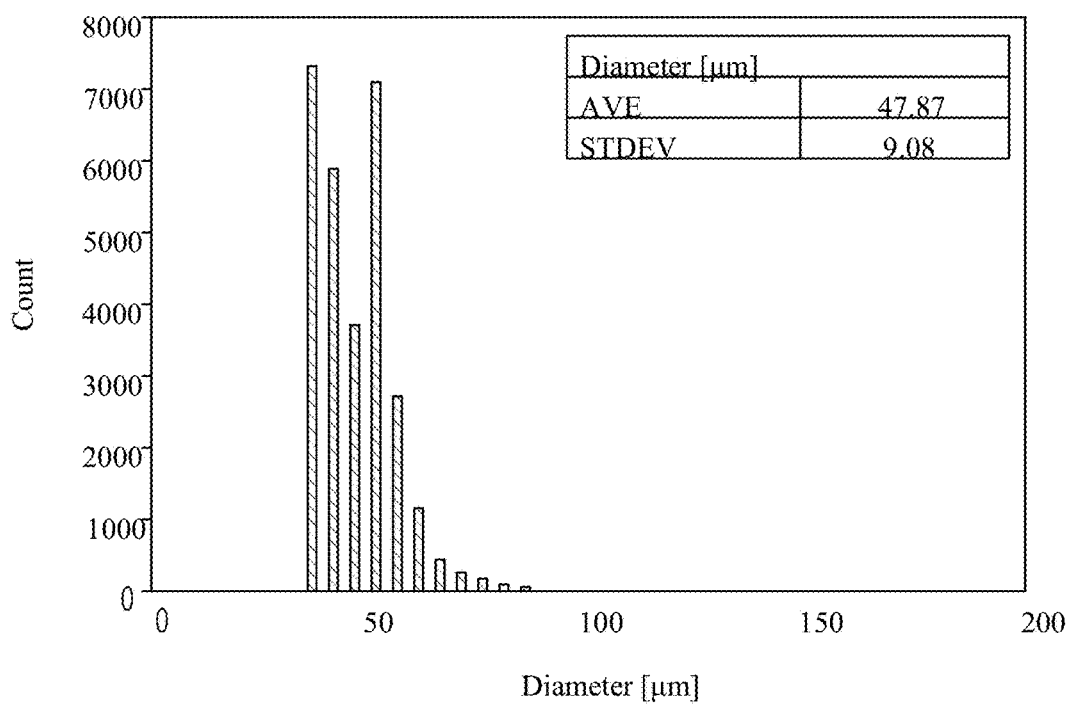
FIG. 5A is a histogram of hole diameters in a glass article made by direct drilling.
Figure 5B:
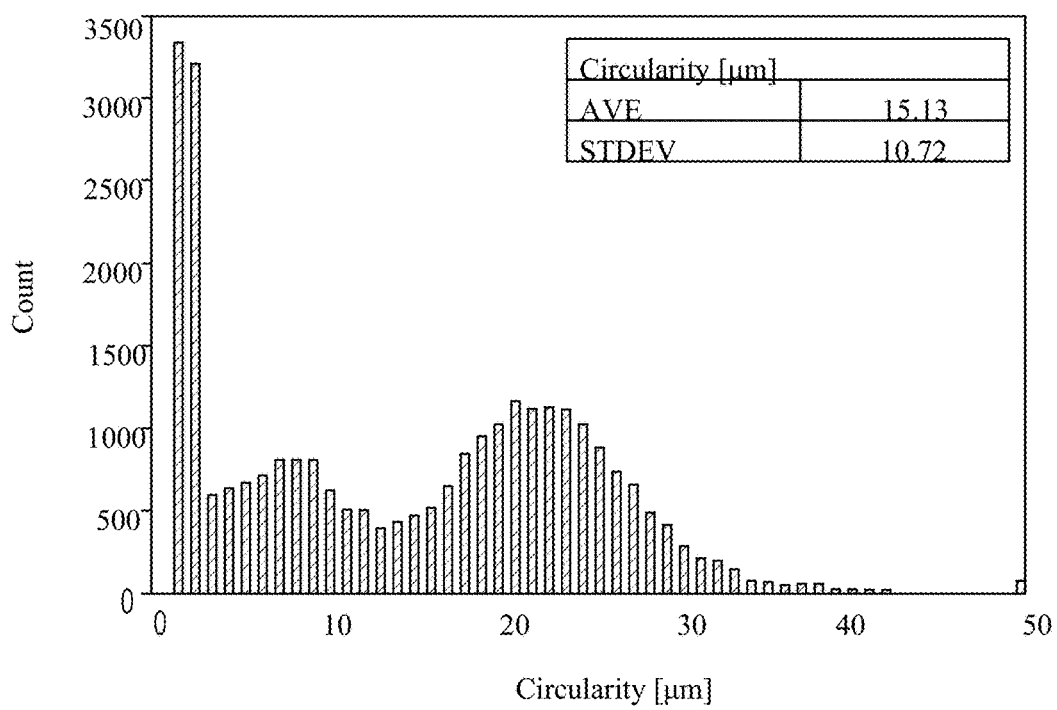
FIG. 5B is a histogram of hole circularity in a glass article made by direct drilling.
Figure 5C:
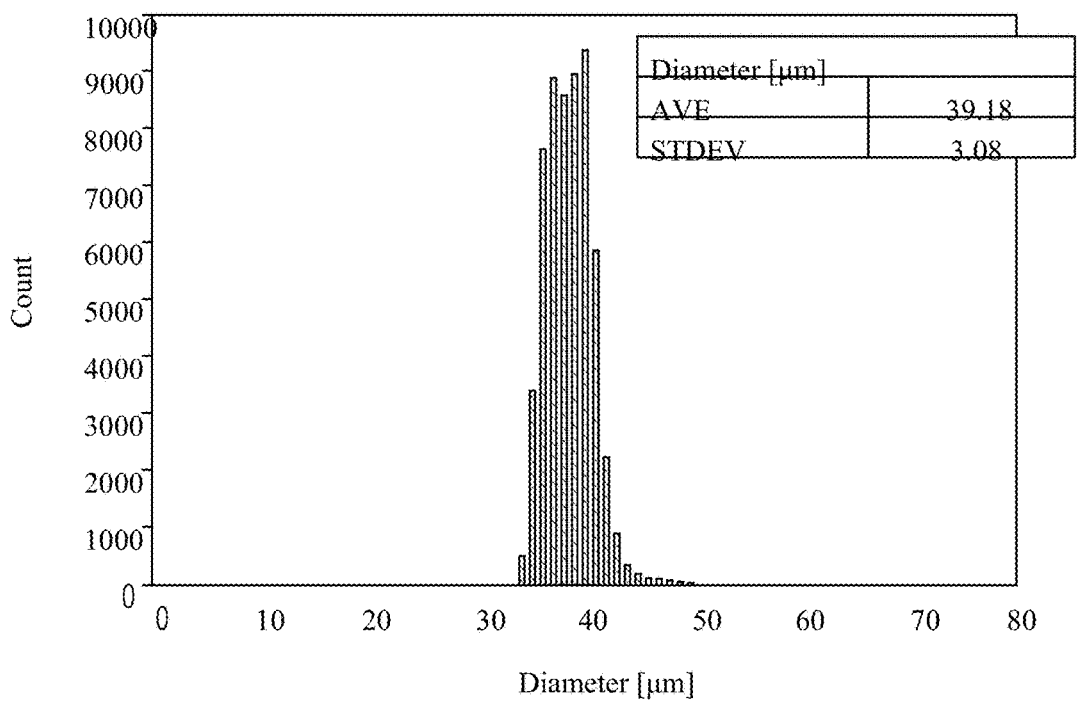
FIG. 5C is a histogram of hole diameters in a glass article made according to one or more embodiments shown and described herein.

FIGS. 5A and 5C are histograms that show a comparison of hole diameters in glass articles formed by direct drilling and holes in glass articles formed using a sacrificial glass cover layer according to embodiments of this disclosure, respectively. In both FIGS. 5A and 5C, the holes are formed in Eagle XG glass manufactured by Corning, Inc. The holes are approximately 280 µm deep blind holes and are formed by the same type of laser. Measurements for each of the glass articles in FIG. 5A and FIG. 5C are taken after an identical etching process has been conducted. As can be seen in FIG. 5A, the average diameter of holes in a glass article formed by direct drilling may be approximately 48 µm, and the standard deviation of the diameters in this glass article may be approximately 9 µm. Conversely, as shown in FIG. 5C, holes in glass articles formed using a sacrificial glass cover layer may have an average diameter of approximately 39 µm and a standard deviation of approximately 3 µm. Thus, FIGS. 5A and 5C show that more precise and uniform hole diameters may be formed using a sacrificial glass cover layer according to embodiments of the present disclosure than through direct drilling.

Figure 5D:
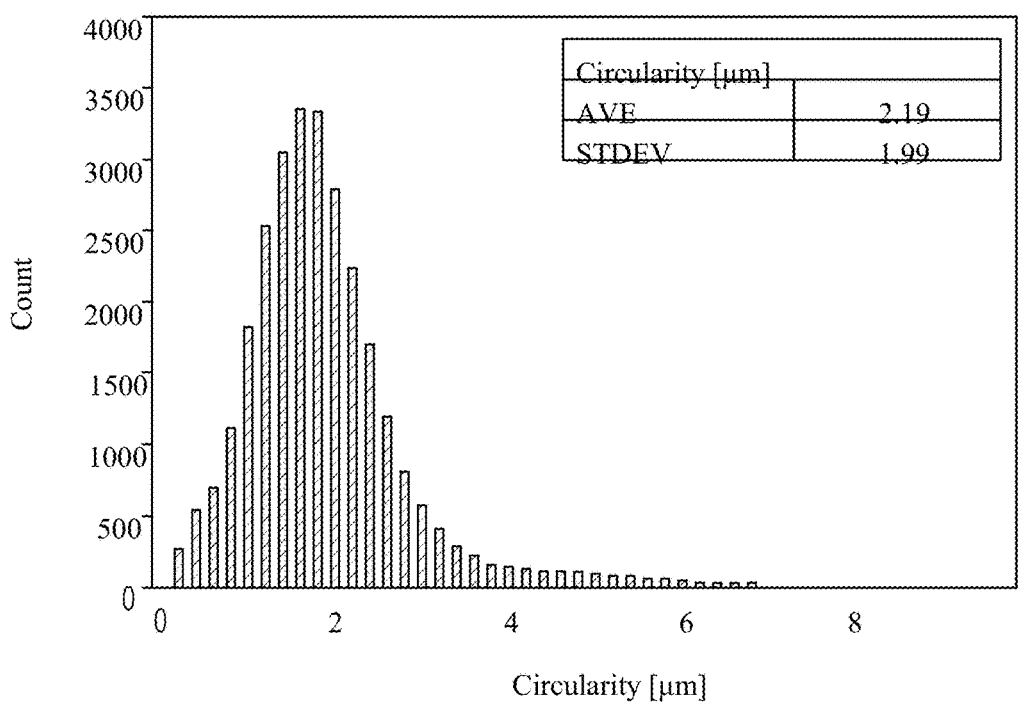
FIG. 5D is a histogram of hole circularity in a glass article made according to one or more embodiments shown and described herein.

Similarly, FIGS. 5B and 5D are histograms that show a comparison of circularity of holes in glass articles formed by direct drilling and holes in glass articles formed using a sacrificial glass cover layer according to embodiments of this disclosure, respectively. The holes measured in FIGS. 5B and 5D are the same as those measured in FIGS. 5A and 5C. As can be seen in FIG. 5B, the average circularity of holes in a glass article formed by direct drilling may be approximately 15 µm, and the standard deviation of the circularity in this glass article may be approximately 11 µm. Conversely, as shown in FIG. 5D, holes in glass articles formed using a sacrificial glass cover layer may have an average circularity of approximately 2 µm and a standard deviation of approximately 2 µm. Thus, FIGS. 5B and 5D show that more precise and uniform hole circularity may be formed using a sacrificial glass cover layer according to embodiments of the present disclosure than through direct drilling.

Figure 6A:
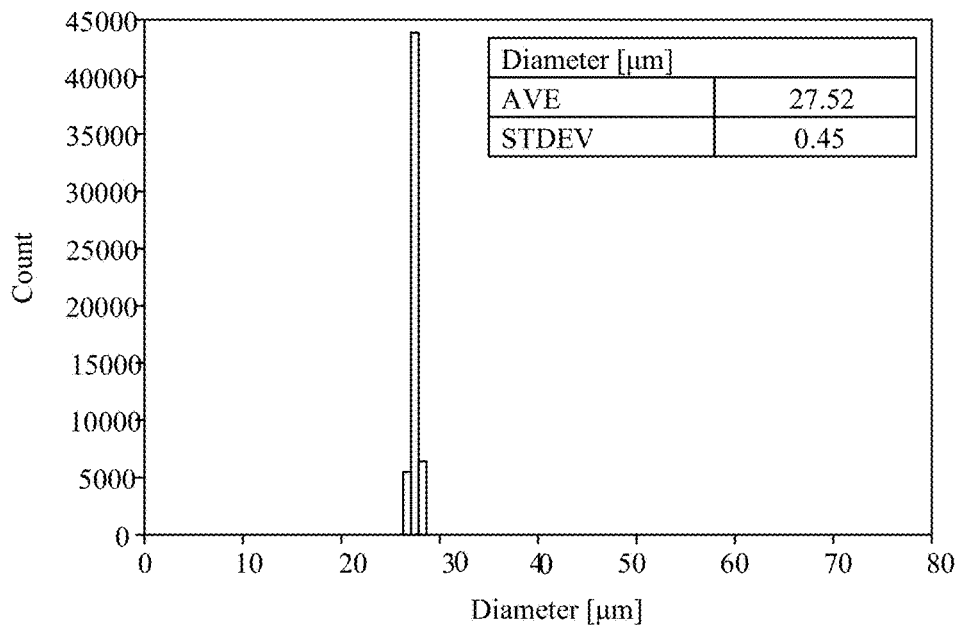
FIG. 6A is a histogram of hole diameters in a glass article shown in FIG. 20 made using a sacrificial polymer cover layer according to one or more embodiments shown and described herein.
Figure 6B:
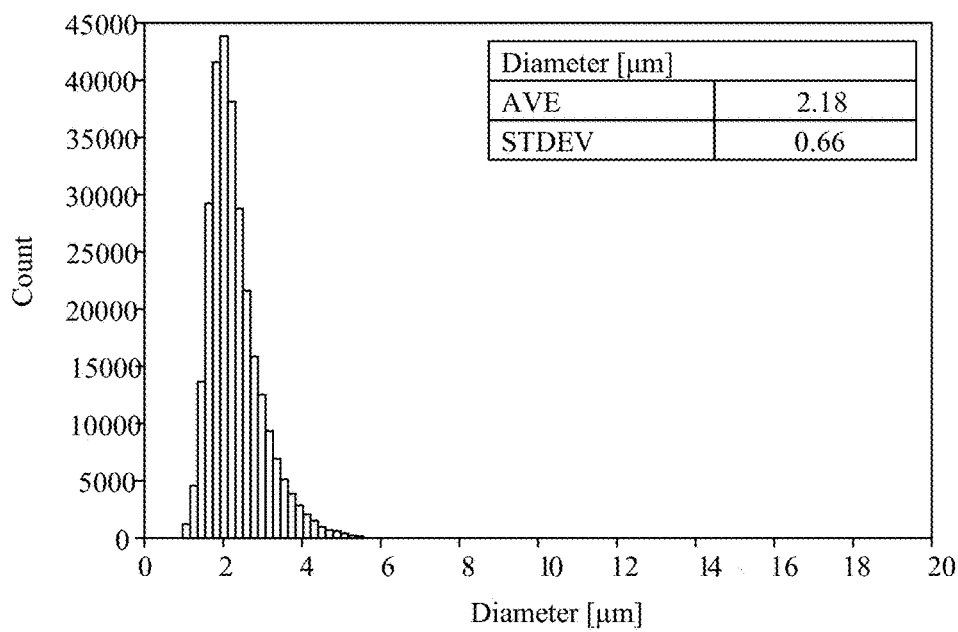
FIG. 6B is a histogram of hole circularity in the glass article shown in FIG. 20 made using a sacrificial polymer cover layer according to one or more embodiments shown and described herein.

FIGS. 6A and 6B are histograms that show hole diameters and circularity of holes in glass articles, respectively, formed using a sacrificial polymer cover layer according to embodiments of this disclosure. The holes measured in FIGS. 6A and 6B are about 200 µm deep blind vias, and the glass article is made from Eagle XG glass manufactured by Corning, Inc. The sacrificial polymer cover layer was about 50 µm thick. As can be seen in FIG. 6A, the average diameter of holes in a glass article formed using a sacrificial polymer cover layer may have an average diameter of approximately 27.52 µm and a standard deviation of approximately 0.45 µm. As can be seen in FIG. 6B, holes in a glass article formed using a sacrificial polymer cover layer may have an average circularity of approximately 2.18 µm and a standard deviation of about 0.66 µm. Thus, FIGS. 6A and 6B show that more precise and uniform hole circularity may also be formed using a sacrificial polymer cover layer according to embodiments of the present disclosure than through direct drilling.

Figure 7A:
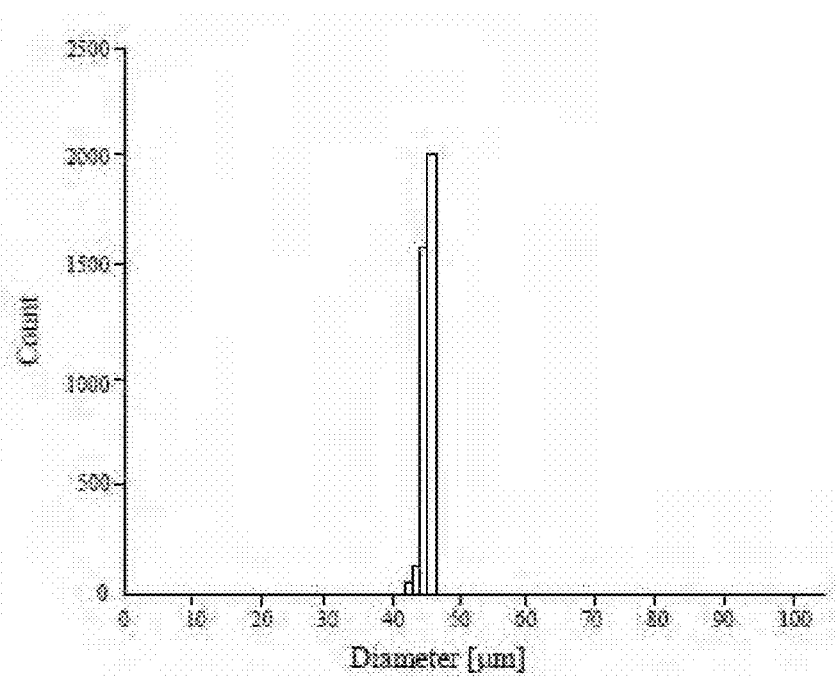
FIG. 7A is a histogram of hole diameters in a glass article made using a pigment or dye-based ink sacrificial cover layer according to one or more embodiments shown and described herein.
Figure 7B:
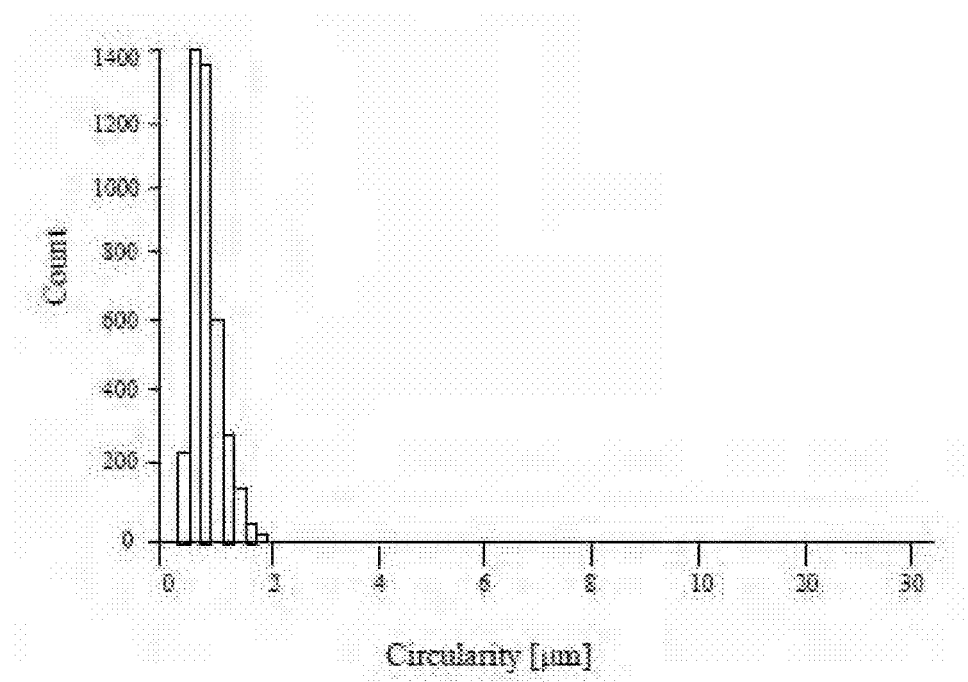
FIG. 7B is a histogram of hole circularity in the glass article made using a pigment or dye-based ink sacrificial cover layer according to one or more embodiments shown and described herein.

FIGS. 7A and 7B are histograms that show hole diameters and circularity of holes in glass articles, respectively, formed using a thin pigment or dye-based ink sacrificial cover layer according to embodiments of this disclosure. The holes measured in FIGS. 7A and 7B are about 300 µm deep through vias, and the glass article is made from Eagle XG glass manufactured by Corning, Inc. The sacrificial polymer cover layer was less than about 10 µm thick. As can be seen in FIG. 7A, the average diameter of holes in a glass article formed using a thin pigment or dye-based ink sacrificial cover layer may have an average diameter of approximately 45 µm and do not exhibit a broad standard deviation. As can be seen in FIG. 7B, holes in a glass article formed using a thin pigment or dye-based ink sacrificial cover layer may have an average circularity of approximately 1.5 µm and a do not exhibit a broad standard deviation. Thus, FIGS. 7A and 7B show that more precise and uniform hole circularity may also be formed using a sacrificial polymer cover layer according to embodiments of the present disclosure than through direct drilling.

Another embodiment provides a work piece used with the above described method. Referring to FIGS. 1A and 4, the work piece may include a glass article 200 and a sacrificial cover layer, such as a sacrificial glass cover layer 100, a sacrificial polymer cover layer 500, or a thin pigment or dye-based ink sacrificial cover layer. The sacrificial cover layer may be detachably attached to the glass article 200. The glass article may have precision holes 210 formed therein by the method described above. Longitudinal axes of the precision holes 210 extend in a thickness direction of the glass article 200. The sacrificial cover layer comprises through holes, each have a longitudinal axis corresponding to a longitudinal axis of a precision hole formed in the glass article. In the case of sacrificial cover layers 100, a gap 300 may be present between the sacrificial cover layer 100 and the glass article 200. The gap 300 may be a thin gap, such as less than 50 µm, less than 10 µm, or less than 1 µm. The gap 300 may be air gap, or the gap may be filled with oil or another fluid that provides attachment. The average roundness of the holes formed in the glass article may be less than about 5 µm, such as less than about 1 µm, less than about 0.5 µm, less than about 0.25 µm, or about 0 µm. The precision holes may have a spacing of from about 200 µm to about 1000 µm, such as from about 200 µm to about 800 µm, from about 200 µm to about 600 µm, from about 250 µm to about 500 µm and from about 300 µm to about 400 µm. Exemplary thicknesses of the sacrificial glass cover layer 100 may be from about 30 µm to about 700 µm, such as from about 50 µm to about 500 µm, from about 150 µm to about 400 µm, or preferably about 300 µm. In the case of sacrificial polymer cover layers 500, the interface between the sacrificial polymer cover layer 500 and the glass article 200 may be substantially gap free. Exemplary thicknesses of the sacrificial polymer cover layer 500 may be less than about 50 µm; however, other thicknesses may be utilized. In the case of sacrificial polymer cover layers 500, the interface between the sacrificial polymer cover layer 500 and the glass article 200 may be substantially gap free. Exemplary thicknesses of the thin pigment or dye-based ink sacrificial cover layer may be less than about 10 µm; however, other thicknesses may be utilized.

EXAMPLES

Embodiments of the present disclosure will be further clarified by the following examples.

Comparative Example 1

Comparative Example 1 shows holes formed in a glass article by direct laser drilling (e.g., no sacrificial cover layer is used).

Figure 8A:
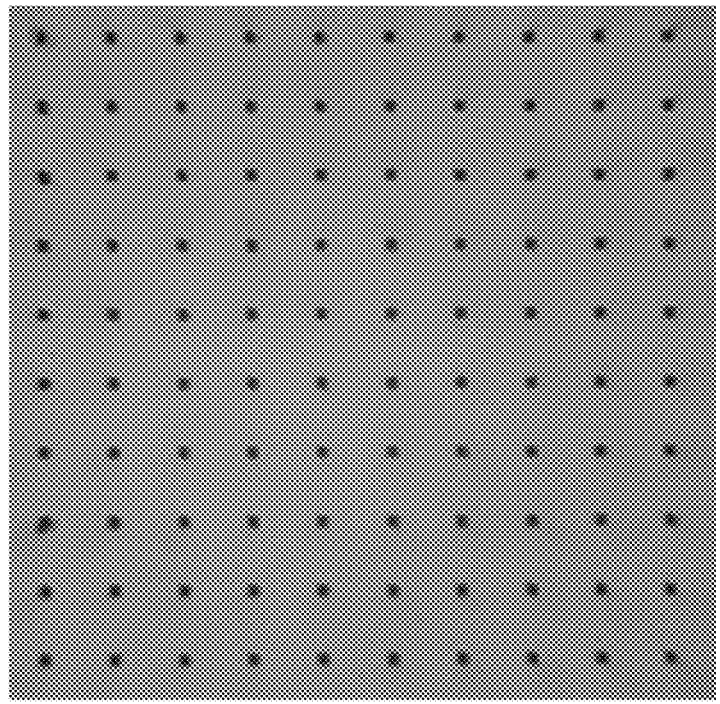
FIGS. 8A and 8B show top views of pre-etch and post-etch 500 μm thick glass where holes were formed by a nanosecond pulsed laser and a sacrificial cover layer was not used.
Figure 8B:
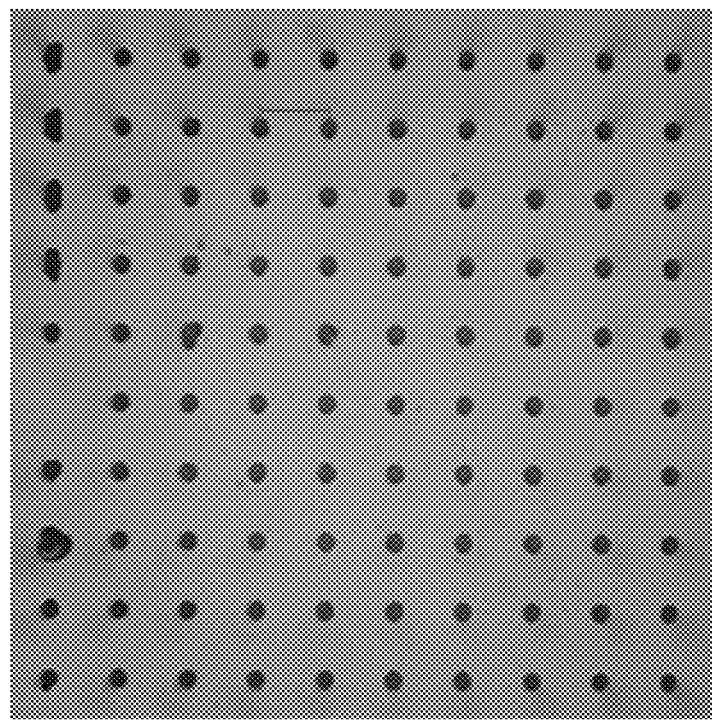
Figure 8C:
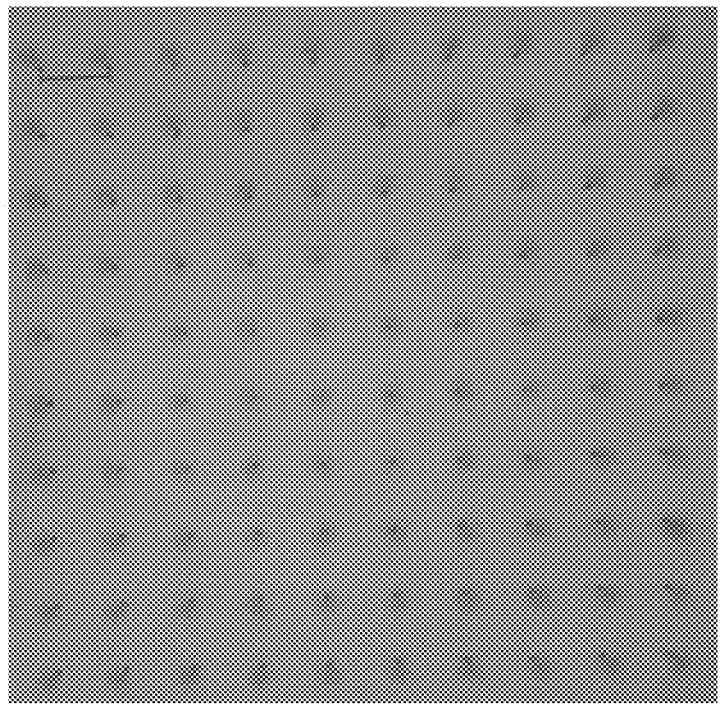
FIGS. 8C and 8D show bottom views of pre-etch and post-etch 500 μm thick glass where holes were formed by a nanosecond pulsed laser and a sacrificial cover layer was not used.
Figure 8D:
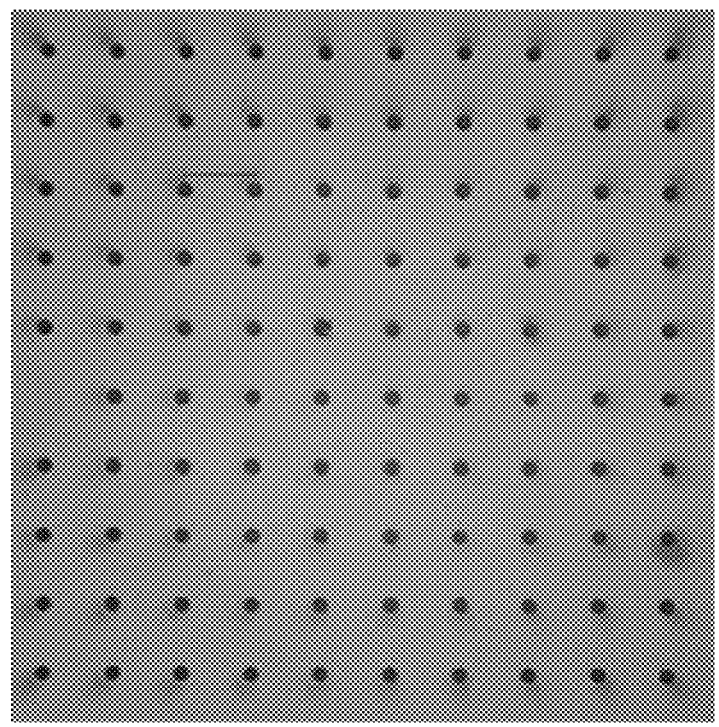

In this comparative example, the glass articles is made of Eagle XG, manufactured by Corning, Inc., and has a thickness of 500 µm and the holes are formed using a 355 nm nanosecond pulsed laser. FIGS. 8A-8D show photographs of top and bottom views of a glass article before and after etching. FIG. 8A shows a top view of the glass article before etching, and FIG. 8B shows a top view of the glass article after etching. FIG. 8C shows a bottom view of the glass article before etching, and FIG. 8D shows a bottom view of the glass article after etching. The photographs on the top show the entrance holes where the laser is incident to the glass article and the photographs on the bottom show the exit holes in a position opposite to the entrance holes in a longitudinal direction. As shown in the photographs of FIGS. 8A-8C, the holes have substantial asymmetries. Particularly, the holes in the top of the glass article after etching have substantial asymmetries.

Comparative Example 2

Comparative Example 2 shows the effects of various laser pulses on the symmetry of hole walls.

Figure 9A:
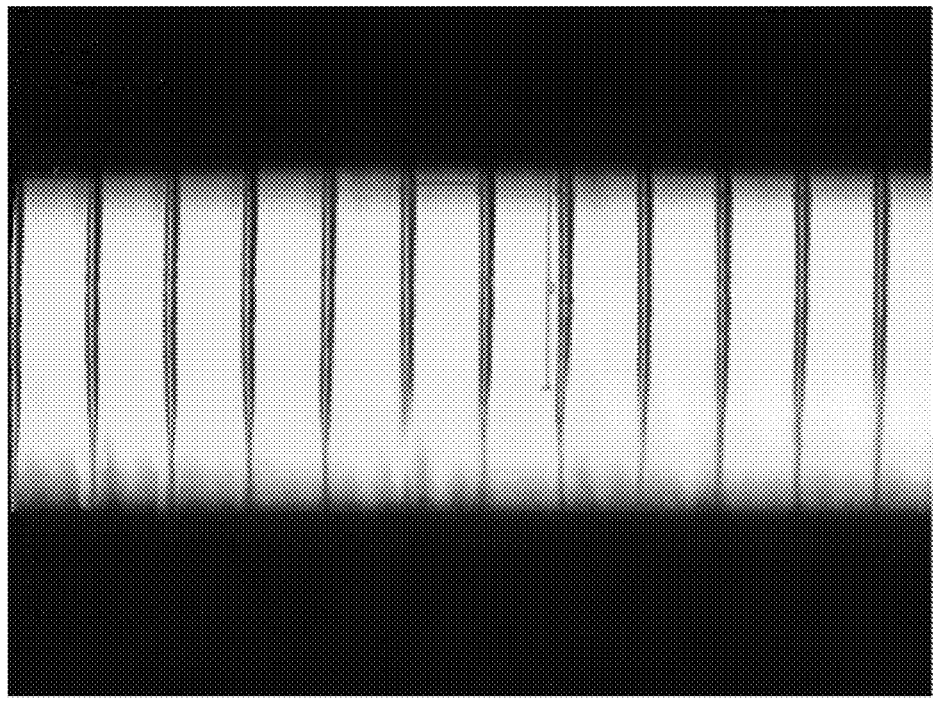
FIGS. 9A and 9B show side views of pre-etch and post-etch 300 μm thick glass, respectively, where holes were formed by a nanosecond pulsed laser and a sacrificial cover layer was not used.
Figure 9B:
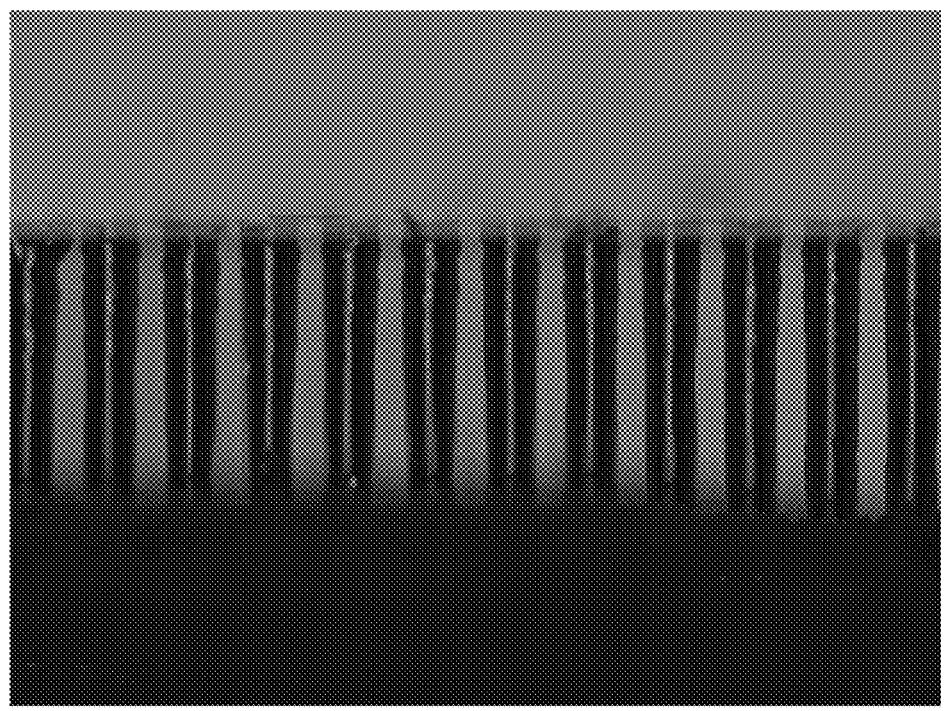
Figure 10A:
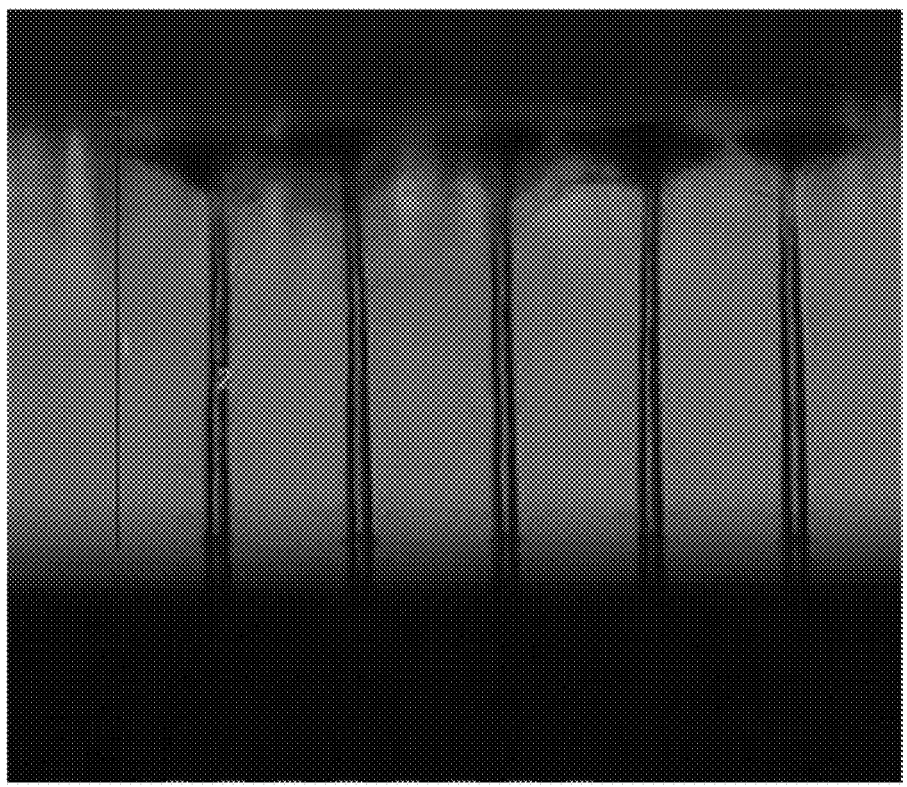
FIGS. 10A and 10B show side views of pre-etch and post-etch 300 μm thick glass, respectively, where holes were formed by a picosecond pulsed laser and a sacrificial cover layer was not used.
Figure 10B:
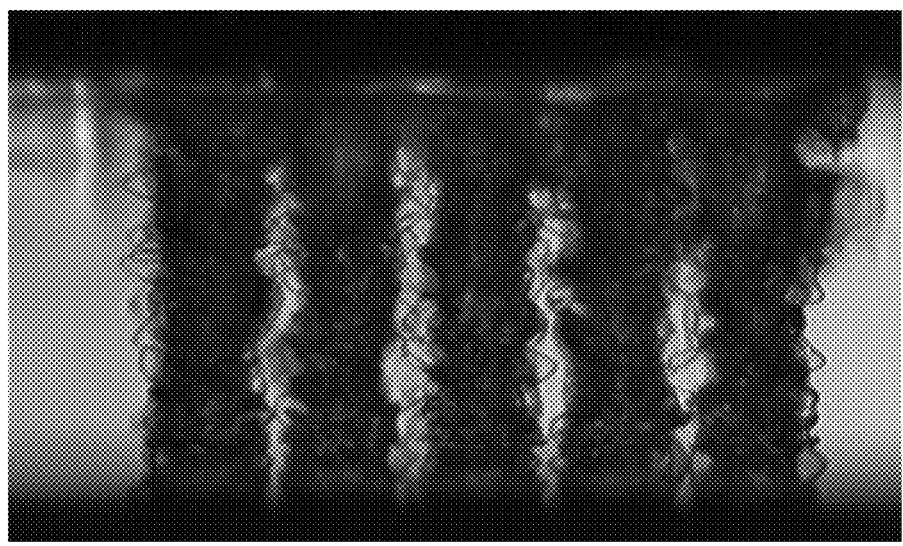

In this comparative example, holes are formed in 300 µm thick glass articles made of Eagle XG, manufactured by Corning, Inc., using nanosecond and picosecond pulses of a 355 nm laser. The holes are formed by direct laser drilling. FIGS. 9A and 9B are side views of holes formed in a glass article with the nanosecond pulsed laser. FIG. 9A shows the holes before etching and FIG. 9B shows the holes after etching. FIGS. 10A and 10B are side views of holes formed in a glass article with the picosecond pulsed laser. FIG. 10A shows the holes before etching and FIG. 10B shows the holes after etching. FIGS. 9A, 9B, 10A, and 10B show asymmetries in the walls of the holes after etching. Particularly, the picosecond pulsed laser method exhibits substantial asymmetries in the walls of the hole after etching.

Comparative Example 3

Figure 11:
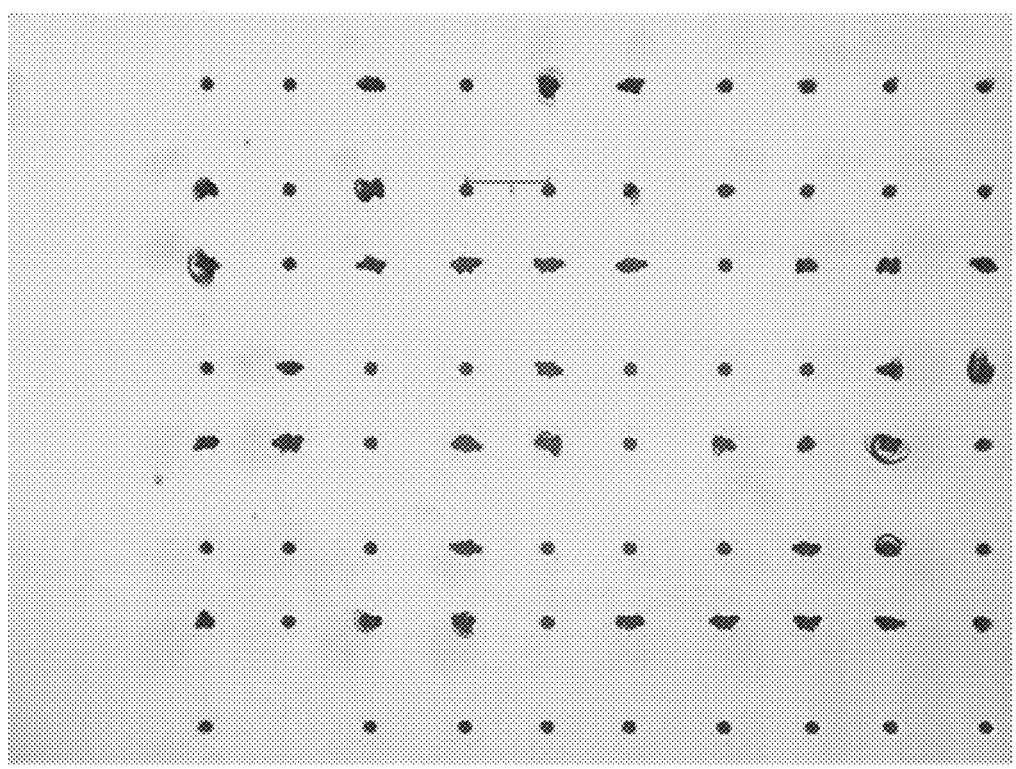
FIG. 11 shows a top view of post-etch 700 μm thick glass where holes were formed by a nanosecond pulsed laser and a sacrificial cover layer was not used.

Comparative Example 3 shows holes formed in a glass article by direct laser drilling Holes are formed in a 700 µm thick glass article using 355 nm nanosecond pulsed laser. The glass article is Eagle XG, manufactured by Corning, Inc. Blind holes (i.e., holes that do not penetrate through the glass article) are formed by direct laser drilling at spacings between 250 µm and 300 µm. FIG. 11 is a top view of holes formed in a glass article with the laser after etching. FIG. 11 shows significant asymmetries in the entrance holes.

Comparative Example 4

Comparative Example 4 also shows the effects of hole spacing on hole symmetry.

Figure 12:
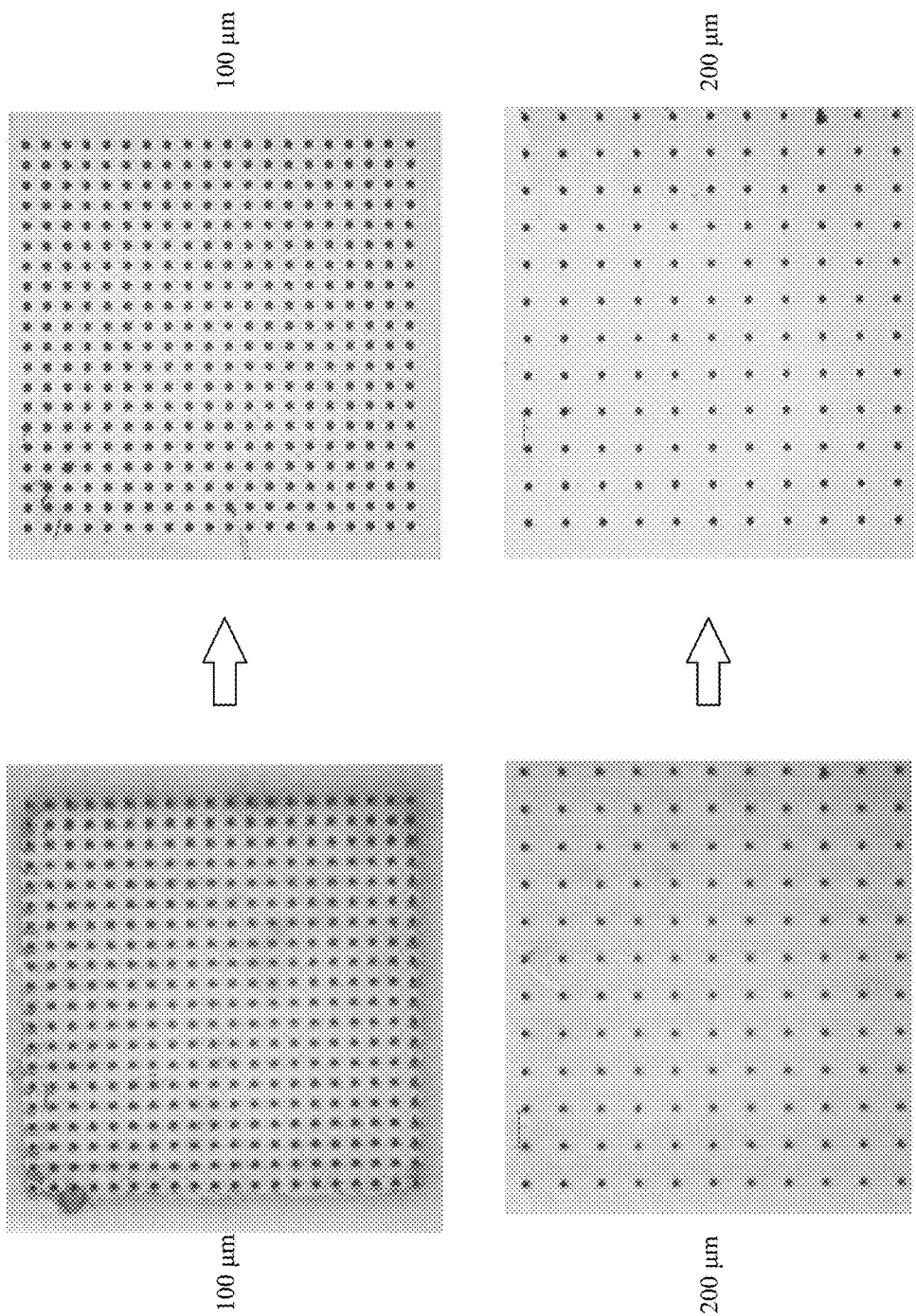
FIG. 12 shows top views of pre-etch and post-etch glass where holes were formed with a nanosecond pulsed laser at 100 μm and 200 μm pitches where a sacrificial cover layer was not used.
Figure 13:
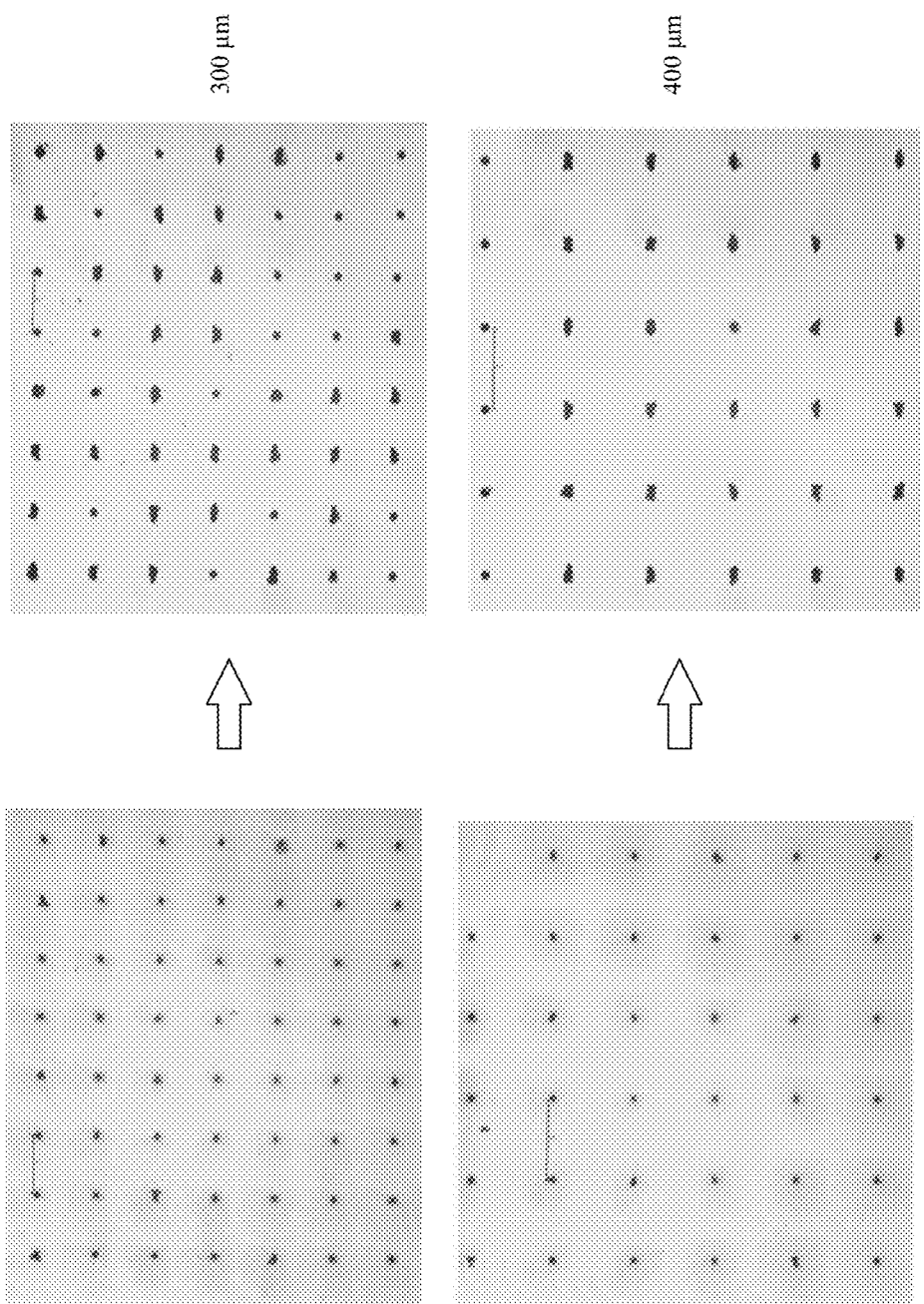
FIG. 13 shows pre-etch and post-etch glass where holes were formed with a nanosecond pulsed laser at 300 μm and 400 μm pitches where a sacrificial cover layer was not used.

Holes with spacings of 100 µm, 200 µm, 300 µm, and 400 µm are formed by direct laser drilling in glass articles made from Eagle XG, manufactured by Corning, Inc. with a 355 nm nanosecond pulsed laser. FIG. 12 shows glass articles with hole spacings of 100 µm (top photographs) and 200 µm (bottom photographs). FIG. 13 shows glass articles with hole spacings of 300 µm and 400 µm. In both FIG. 12 and FIG. 13, the left photographs show the glass articles before etching and the right photographs show the glass articles after etching. A comparison of FIGS. 12 and 13 shows that asymmetries are more prevalent in the glass articles with 300 µm hole spacings and 400 µm hole spacings then in the glass articles with 100 µm hole spacings and 200 µm hole spacings. Thus, Comparative Example 4 shows increased asymmetries in glass articles with hole spacings above 200 µm.

Comparative Example 5

Comparative Example 5 shows the effect of hole diameter and hole spacing on symmetry of the holes.

Figure 14:
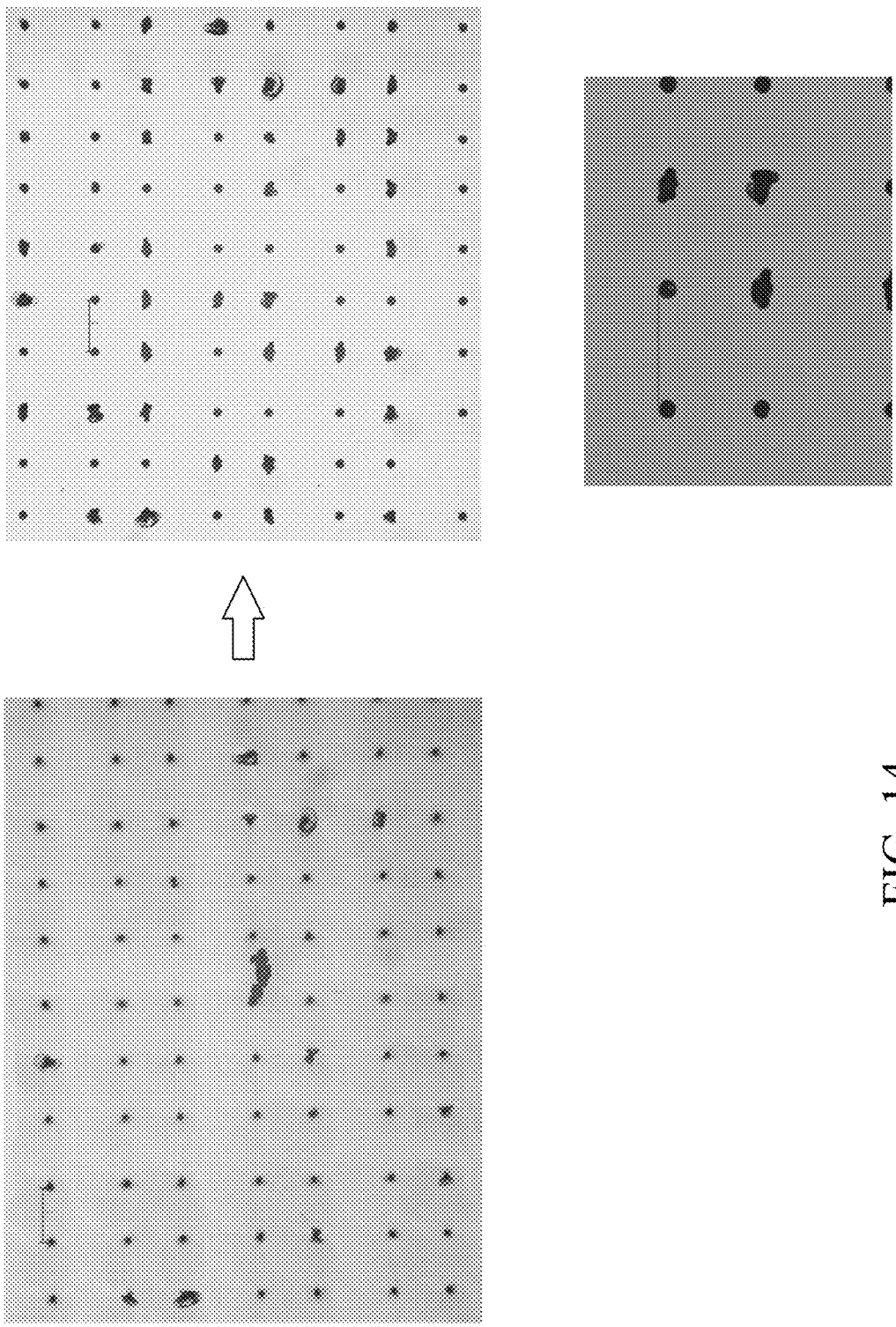
FIG. 14 shows a top view of pre-etch and post-etch glass where holes having a pitch of 250 μm were formed by a nanosecond pulsed laser where a sacrificial cover layer was not used.

Holes with spacings of about 250 µm and diameters of about 40 µm (after etching) are formed by direct laser drilling in a glass article made of Eagle XG, manufactured by Corning, Inc. with a 355 nm nanosecond pulsed laser. In FIG. 14, the left photograph shows the glass article before etching and the right photograph shows the glass article after etching. The inlay in FIG. 14 shows the holes at higher magnification. FIG. 14 shows that chips and cracks on the entrance side of the glass article create substantial asymmetries that result in an unacceptable average roundness of the holes formed in this comparative example.

Comparative Example 6

Comparative Example 6 also shows the effect of hole diameter and hole spacing on symmetry of the holes.

Figure 15:
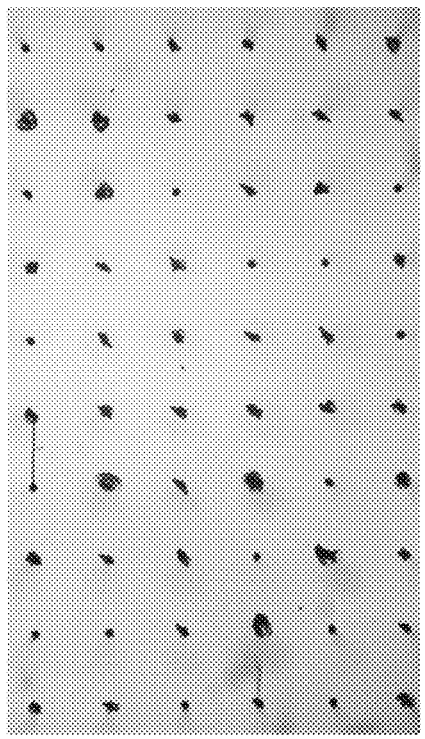
FIG. 15 shows top views of pre-etch and post-etch glass where 30 μm holes having a hole pitch between 250 μm and 340 μm were formed by a nanosecond pulsed laser where a sacrificial cover layer was not used.
Figure 15:
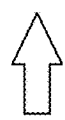
Figure 15:
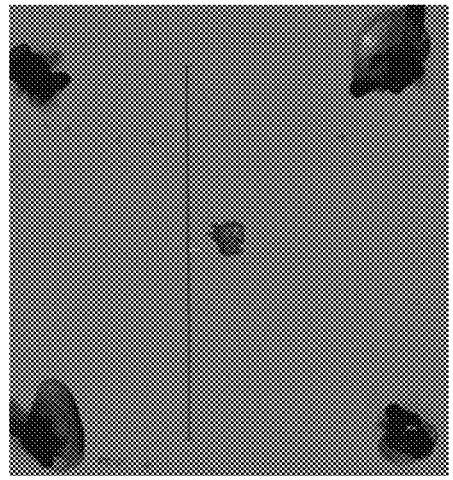
Figure 15:
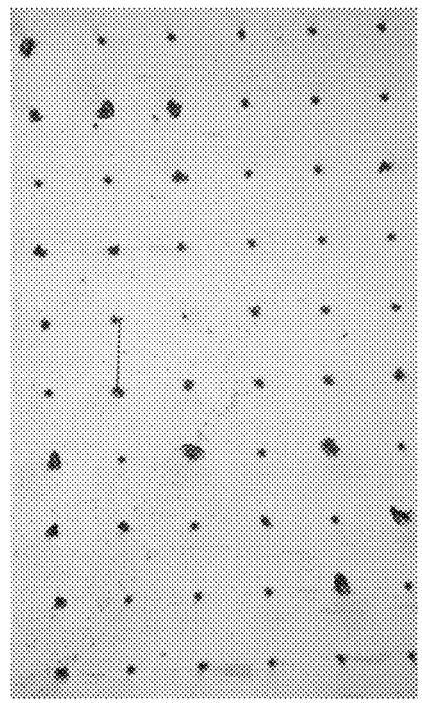

Holes with spacings of about 300 µm and diameters of about 30 µm (after etching) are formed by direct laser drilling in a glass article made of Eagle XG, manufactured by Corning, Inc. with a 355 nm nanosecond pulsed laser. In FIG. 15, the left photograph shows the glass article before etching and the right photograph shows the glass article after etching. The inlay in FIG. 15 shows the holes at higher magnification. FIG. 15 shows that chips and cracks on the entrance side of the glass article create substantial asymmetries that result in an unacceptable average roundness of the holes formed in this comparative example.

Example 1

Example 1 shows the effect of forming holes in a glass article according to a sacrificial glass cover layer method described herein.

Figure 16:
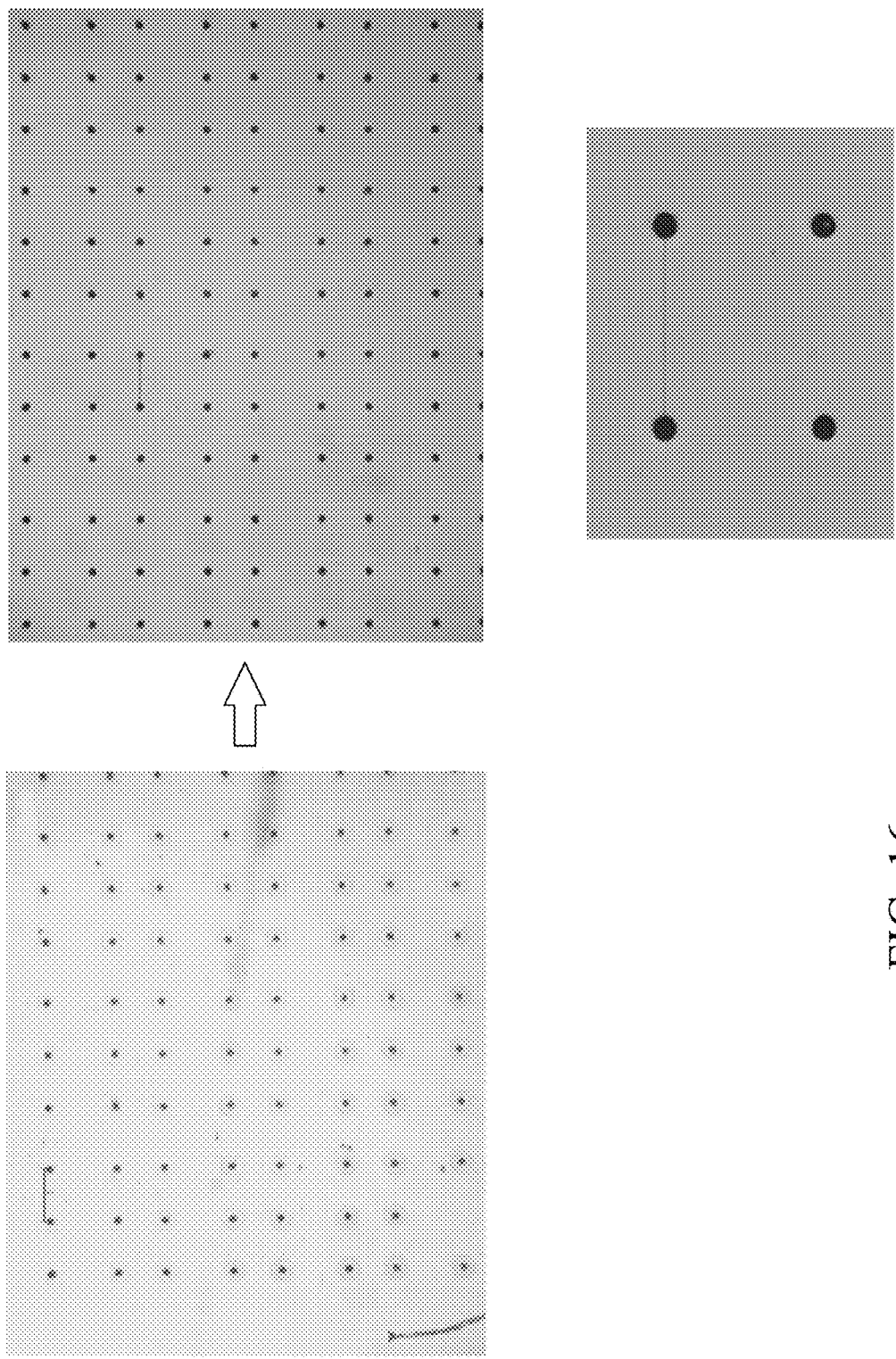
FIG. 16 shows top views of pre-etch and post-etch glass where holes were formed with a nanosecond pulsed laser and the pitch of the holes is 250 μm and a sacrificial cover layer was used according to one or more embodiments shown and described herein.

A 355 nm nanosecond pulsed laser is first used to form through holes in a sacrificial glass cover layer made of Eagle XG, manufactured by Corning, Inc and having a thickness of 320 μm. Subsequently, holes are formed in the glass article made of Eagle XG, manufactured by Corning, Inc. by pulsing the laser through the through holes formed in the sacrificial glass cover layer and onto a surface of the glass article. The spacing of the holes is about 250 μm and the post-etch diameter of the holes is about 35 μm. FIG. 16 shows top views of the glass article. The photograph on the left shows the glass article before etching and the photograph on the right shows the glass article after etching. The inlay in FIG. 16 shows the holes at higher magnification. As can be seen from FIG. 16, the holes formed in the glass article have very circular shapes, even after the etching process. The roundness of the holes in the glass article, even after etching, is much improved by using the sacrificial glass cover layer, as can be seen in a comparison of Example 1 to Comparative Example 5.

Example 2

Example 2 shows the effect of forming blind holes (i.e., holes that do not penetrate the glass article) in a glass article according to a sacrificial glass cover layer method described herein.

Figure 17:
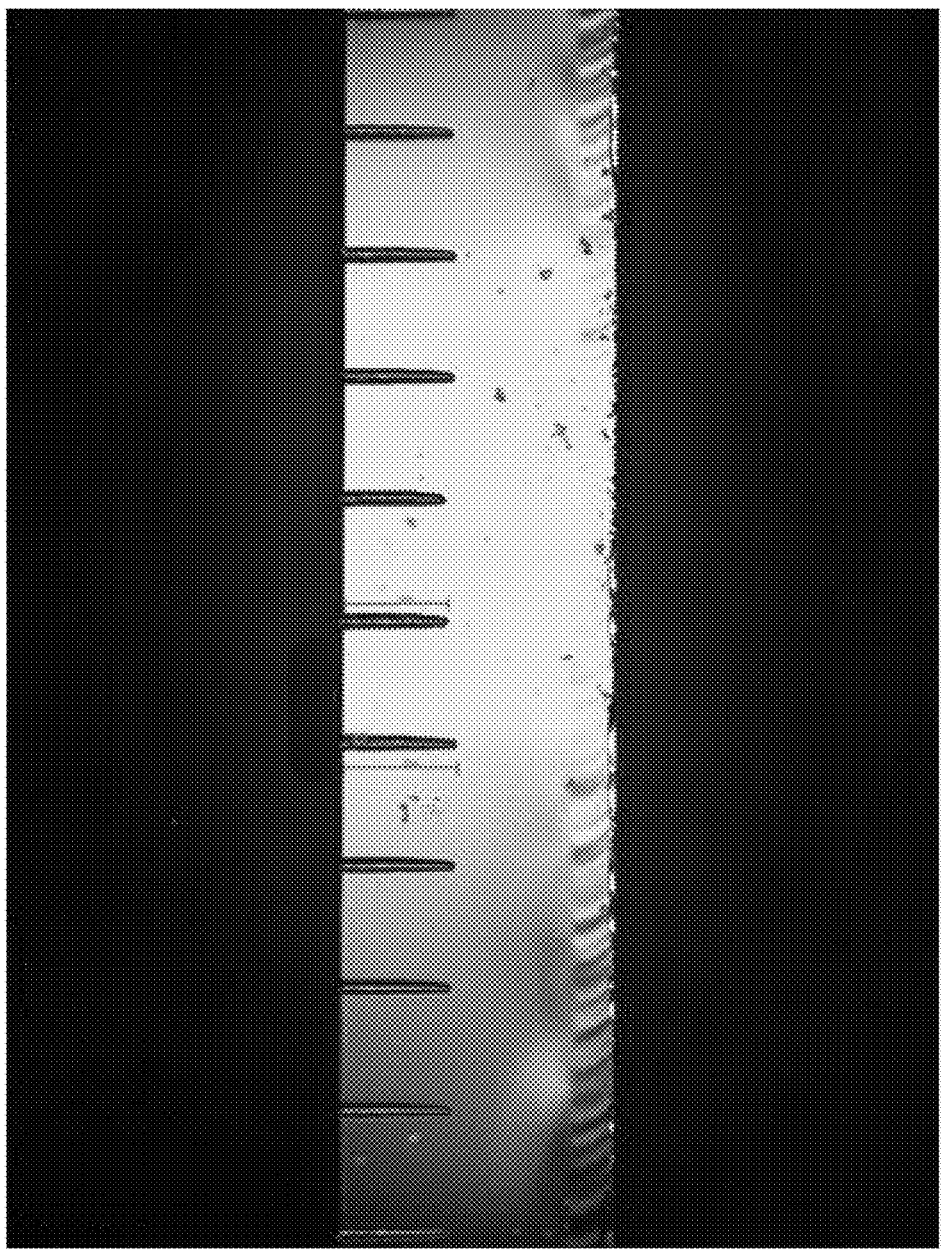
FIG. 17 shows a side view of post-etch glass where blind holes were formed with a nanosecond pulsed laser and a sacrificial cover layer was used according to one or more embodiments shown and described herein.
Figure 18:
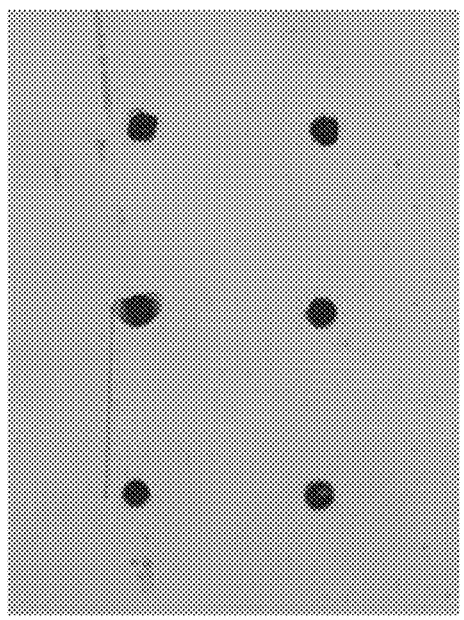
FIG. 18 shows top views of post-etch glass where holes were formed using a sacrificial glass cover layer and air, water, or vegetable oil used between the glass and the sacrificial cover layer according to one or more embodiments shown and described herein.
Figure 18:
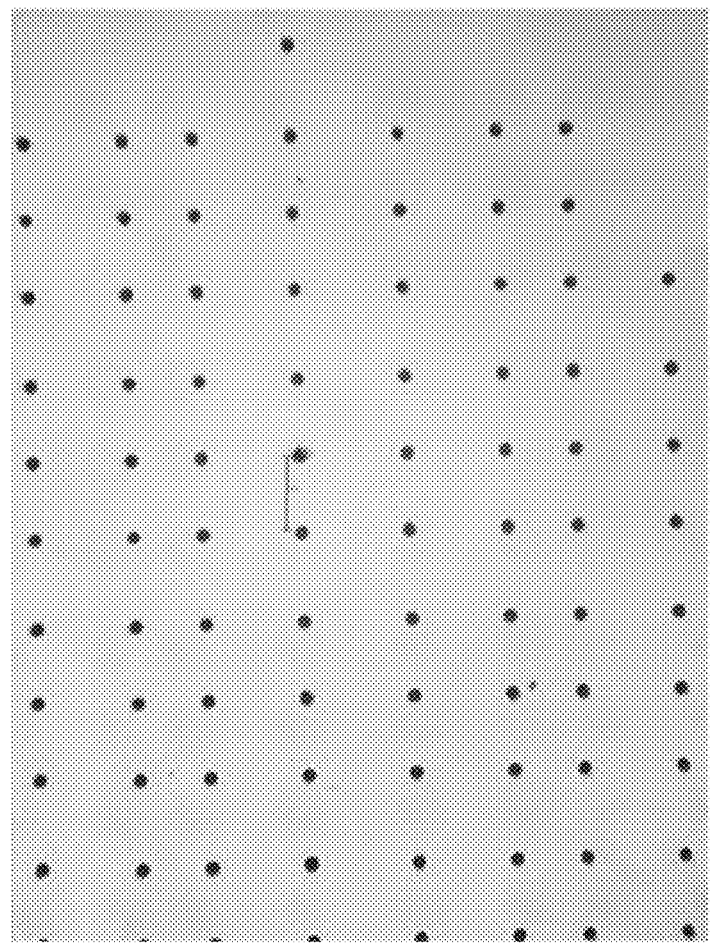

A 355 nm nanosecond pulsed laser is first used to form through holes in a sacrificial glass cover layer made of Eagle XG, manufactured by Corning, Inc and having a thickness of 150 μm. Subsequently, holes are formed in the glass article made of Eagle XG, manufactured by Corning, Inc. by pulsing the laser through the through holes formed in the sacrificial glass cover layer and onto a surface of the glass article. The diameter of the holes is about 36 μm and the holes are about 280 μm deep. FIG. 17 shows a top view of the glass article after etching. FIG. 18 shows a side view of the holes after etching. The inlay in FIG. 18 shows the holes at higher magnification. As can be seen from FIGS. 17 and 18, the blind holes formed in the glass article have very circular shapes, even after the etching process. The roundness of the holes in the glass article, even after etching, is much improved by using the sacrificial glass cover layer.

Example 3

Example 3 compares the effect of focus position on hole symmetry and quality using a direct laser drilling method and a sacrificial glass cover layer method as described herein.

Figure 19:
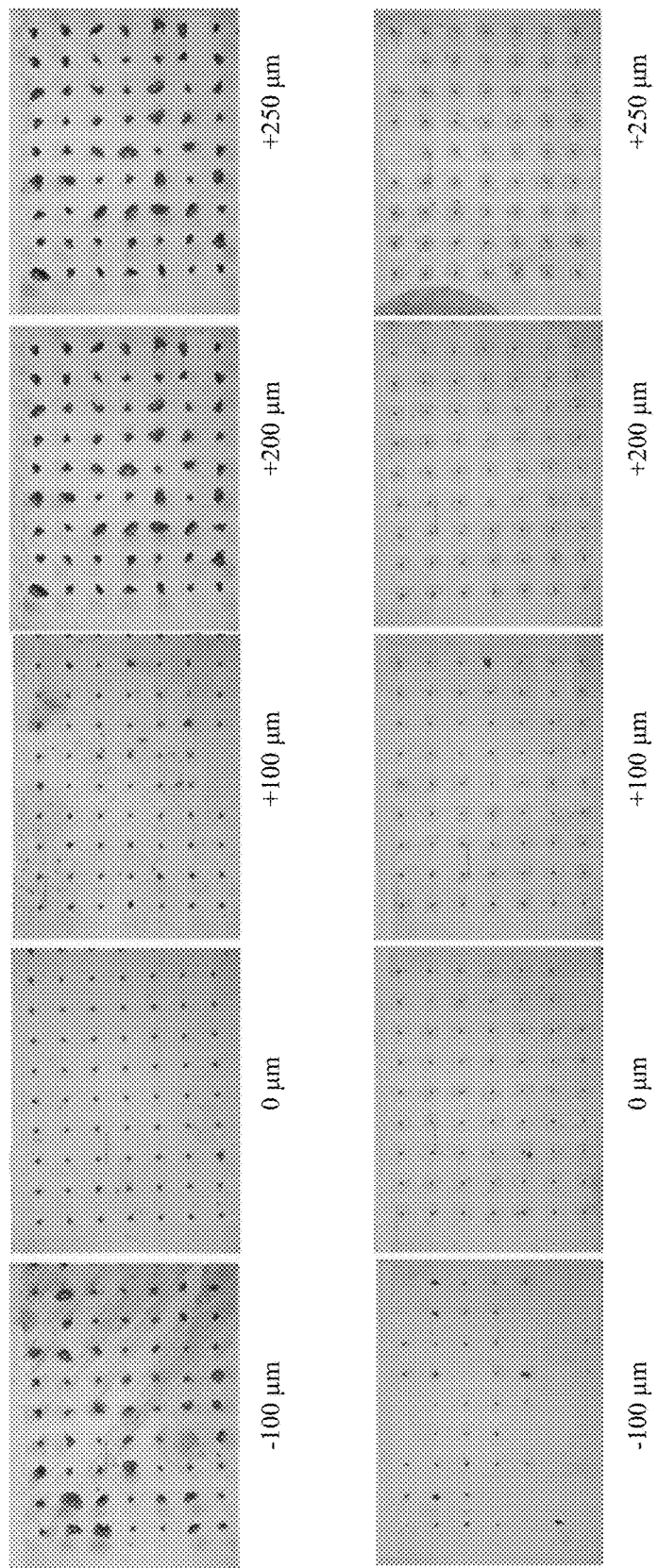
FIG. 19 shows top views of pre-etch glass where holes were formed at different focus positions, wherein the top row shows post-etch glass where a sacrificial cover layer was not used, and the bottom row shows post-etch glass where a sacrificial glass cover layer was used according to one or more embodiments shown and described herein.

A 355 nm nanosecond pulsed laser is used to form holes in a glass article made of Eagle XG, manufactured by Corning, Inc. A direct laser drilling method as described in Comparative Example 1 and a laser drilling method using a sacrificial glass cover layer as described in Example 1 is used. The focus position of the laser was adjusted from −100 μm, 0 μm, 100 μm, 200 μm, and 250 μm where negative numbers indicate a focus location above the topmost glass surface and positive numbers indicate a focus location below the topmost glass surface. FIG. 19 shows the entrance holes of the glass articles before etching. The top row of photographs shows the glass articles prepared by direct laser drilling and the bottom row of photographs show the glass articles prepared using a sacrificial glass cover layer. As seen in FIG. 19, the direct laser drilling method only provides acceptable results at a focus location of 0 μm. In contrast, a laser drilling method using a sacrificial glass cover layer as described herein provides acceptable results at nearly all focus locations.

Example 4

Example 4 shows the effect of forming through holes in a glass article according to a sacrificial polymer cover layer method described herein.

Figure 20:
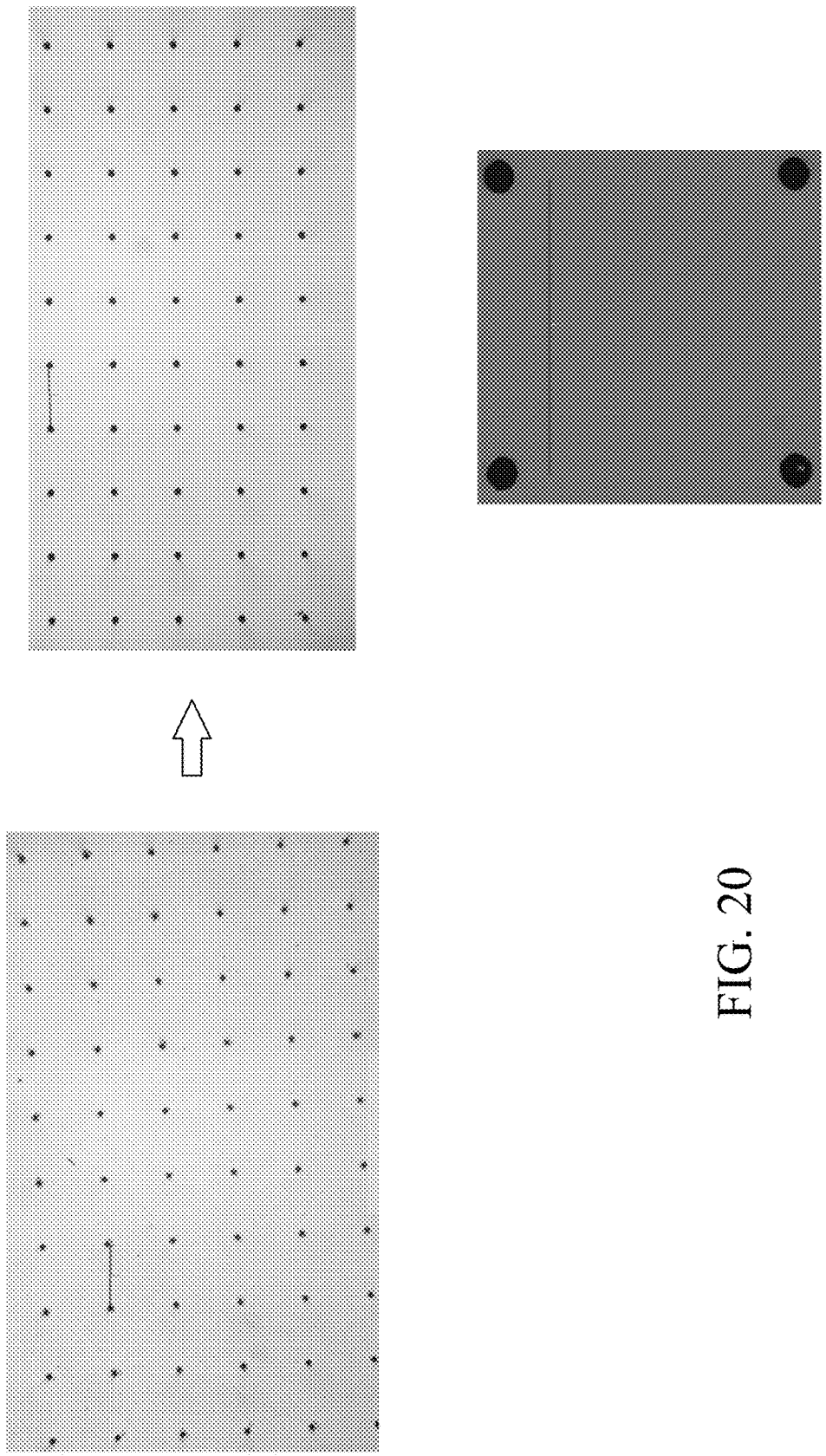
FIG. 20 shows top views of pre-etch and post-etch glass where 30 μm holes having a hole pitch between 250 μm and 350 μm were formed with a nanosecond pulsed laser, and a 50 μm thick sacrificial polymer cover layer was used according to one or more embodiments shown and described herein.

A 50 μm thick sacrificial polymer cover layer in the form of Lens Bond Type P-92 is applied by slot coating to a surface of a glass article made of 625 μm thick Eagle XG glass manufactured by Corning, Inc. The sacrificial polymer cover layer is UV cured by a single-pass Fusion UV system (254 mm, 23.622 W/in UV-d lamp operated at 100% power) at 2.1336 meters per minute. A 355 nm nanosecond pulsed laser is first used to form through holes in a sacrificial polymer cover layer made of Eagle XG, manufactured by Corning, Inc, and having a thickness of 150 μm. Subsequently, holes are formed in the glass article by pulsing the laser beam through the through holes formed in the sacrificial polymer cover layer and onto a surface of the glass article. The diameter of the holes is about 30 μm, and the spacing of the holes is about 300 μm. FIG. 20 shows top views of the glass article. The photograph on the left of FIG. 20 shows the glass article before etching and the photograph on the right shows the glass article after etching. The inlay in FIG. 20 shows the holes at higher magnification. As can be seen from FIG. 20, the holes formed in the glass article have very circular shapes, even after the etching process. The roundness of the holes in the glass article, even after etching, is much improved by using the sacrificial polymer cover layer, as can be seen in a comparison of Example 4 to Comparative Example 5.

Example 5

Example 5 shows the effect of forming blind holes (i.e., holes that do not penetrate the glass article) in a glass article according to a sacrificial polymer cover layer method described herein.

Figure 21:
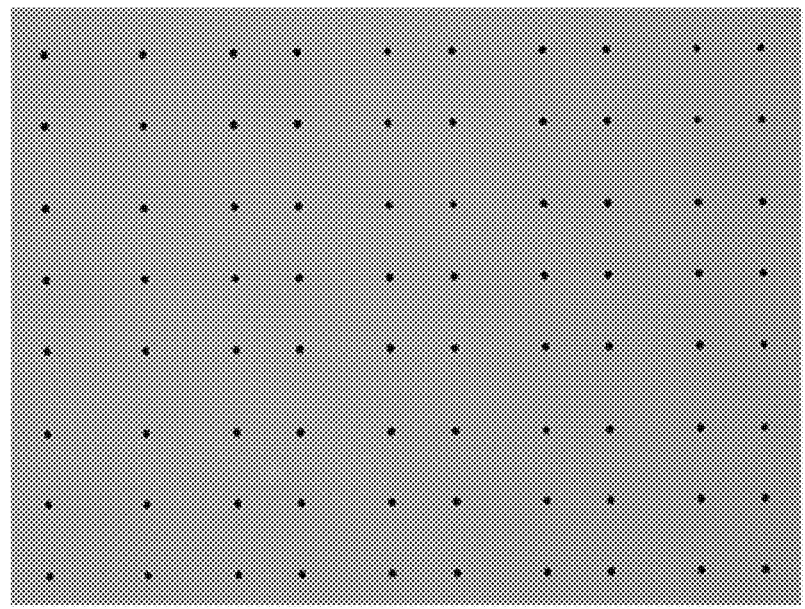
FIG. 21 shows a top view of post-etch glass where 25 μm diameter, 200 μm deep holes were formed with a nanosecond pulsed laser, and a 50 μm thick sacrificial polymer cover layer was used according to one or more embodiments shown and described herein.

A 50 μm thick sacrificial polymer cover layer in the form of Lens Bond Type P-92 is applied by slot coating to a surface of a glass article made of 700 μm thick Eagle XG glass manufactured by Corning, Inc. The sacrificial polymer cover layer is UV cured by a single-pass Fusion UV system (254 mm, 23.622 W/mm UV-d lamp operated at 100% power) at 2.1336 meters per minute. A 355 nm nanosecond pulsed laser operated as described above with respect to Example 4 is first used to form through holes in a sacrificial polymer cover layer. Subsequently, holes are formed in the glass article by pulsing the laser through the through holes formed in the sacrificial glass cover layer and onto a surface of the glass article. The diameter of the holes is about 25 μm and the holes are about 200 μm deep after etching. FIG. 21 shows a top view of the glass article after etching. The photograph of FIG. 21 corresponds to the histograms of FIGS. 6A and 6B, and show exemplary images of holes for a glass article made with more than 50,000 holes. None of the holes exhibit any entrance defects.

Example 6

Example 6 shows the effect of sacrificial polymer cover layer thickness on through-hole symmetry and quality using a sacrificial polymer cover layer method described herein.

Figure 22:
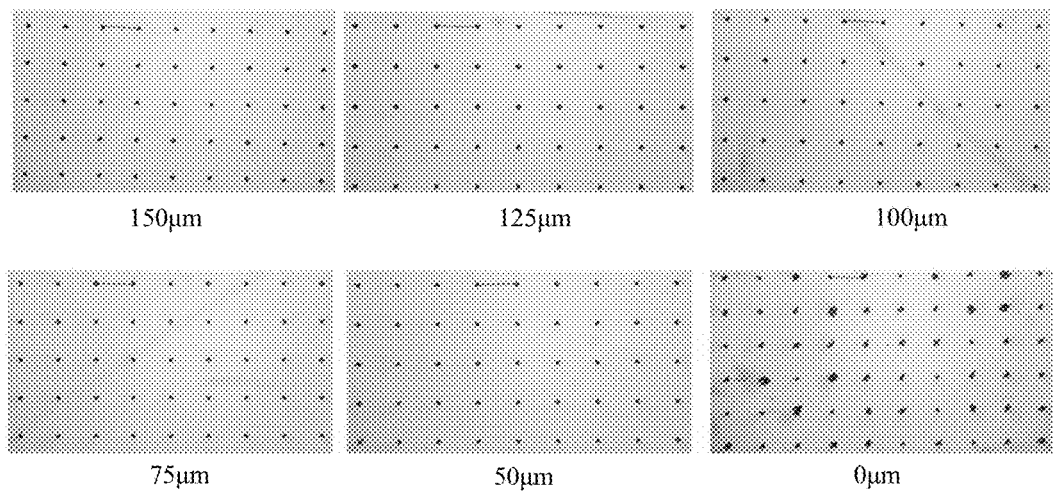
FIG. 22 shows a top view of post-etch glass where 25 μm diameter holes were formed with a nanosecond pulsed laser, and sacrificial polymer cover layers of varying thicknesses was used according to one or more embodiments shown and described herein.

Sacrificial polymer cover layers in the form of Lens Bond Type P-92 are applied by slot coating to a surface of glass articles made of 625 µm thick Eagle XG glass manufactured by Corning, Inc. The sacrificial polymer cover layers are UV cured by a single-pass Fusion UV system (254 mm, 23.622 W/mm UV lamp operated at 100% power) at 2.1336 meters per minute. The thicknesses of the sacrificial polymer cover layers are 150 µm, 125 µm, 100 µm, 75 µm, 50 µm, and 0 µm (no sacrificial polymer cover layer). A 355 nm nanosecond pulsed laser operated as described above with respect to Example 4 is first used to form through holes in a sacrificial polymer cover layer (or glass article in the case of the glass article with no sacrificial polymer cover layer applied thereto). Subsequently, holes are formed in the glass articles by pulsing the laser through the through holes formed in the sacrificial glass cover layer and onto a surface of the glass article. The diameter of the holes is about 35 µm after etching. FIG. 22 shows a top view of the glass articles after etching. As seen in FIG. 22, for all thicknesses of sacrificial polymer cover layer used, the cracking and chipping of the entrance holes is eliminated, while identical laser process conditions for the 0 µm (no sacrificial polymer cover layer) has extensive entrance hole cracking. Examination was also made of the exit holes, which remained circular in all cases.

Example 7

Example 7 shows the effect of hole pitch on through-hole symmetry and quality using a sacrificial polymer cover layer method described herein.

Figure 23:
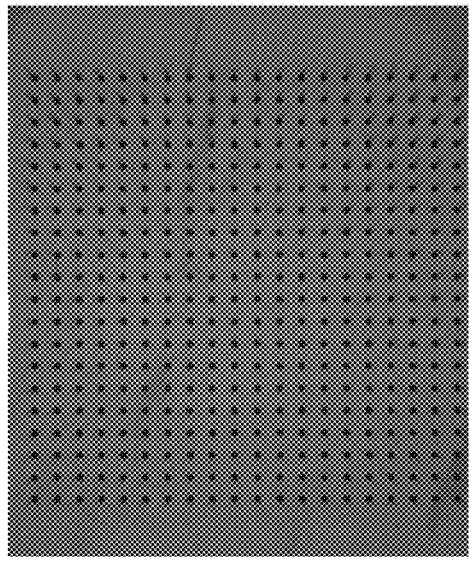
FIG. 23 shows a top view of post-etch glass where 50 μm diameter holes of different hole-pitches were formed with a nanosecond pulsed laser, and a 50 μm thick sacrificial polymer cover layer was used according to one or more embodiments shown and described herein.
Figure 23:
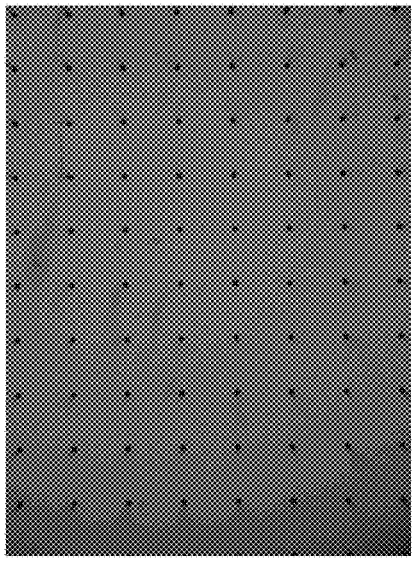
Figure 23:
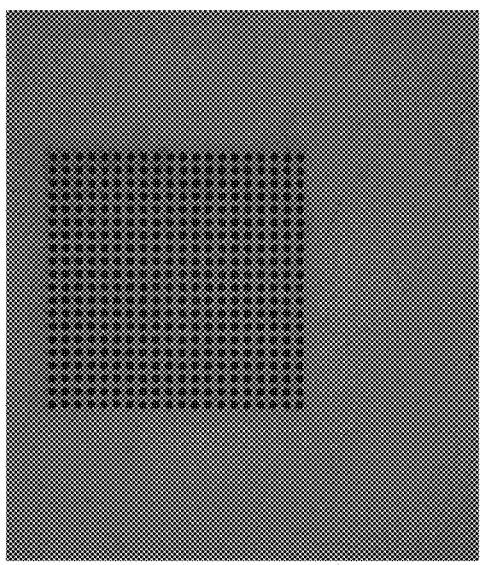
Figure 23:
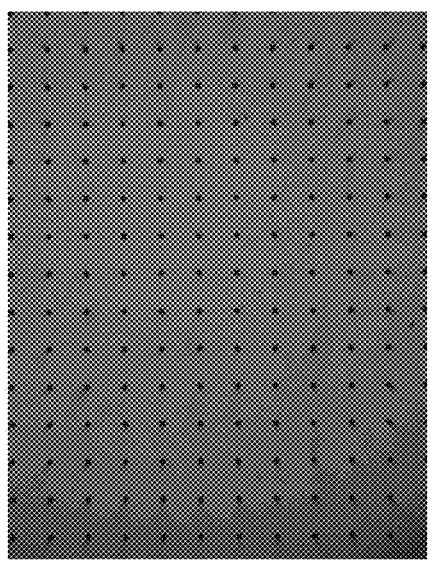

Sacrificial polymer cover layers in the form of 50 µm thick Lens Bond Type P-92 are applied by slot coating to a surface of glass articles made of 625 µm thick Eagle XG glass manufactured by Corning, Inc. The sacrificial polymer cover layers are UV cured by a single-pass Fusion UV system (254 mm, 23.622 W/mm UV-d lamp operated at 100% power) at 2.1336 meters per minute. A 355 nm nanosecond pulsed laser operated as described above with respect to Example 4 is first used to form through holes in a sacrificial polymer cover layer at a pitch of 50 µm, 100 µm, 200 µm, and 300 µm. Subsequently, holes are formed in the glass articles by pulsing the laser through the through holes formed in the sacrificial glass cover layer and onto a surface of the glass article. The diameter of the holes is about 50 µm after etching. FIG. 23 shows a top view of the glass articles after etching. As seen in FIG. 23, for all cases, the cracking and chipping of the entrance holes is eliminated.

Example 8

Example 8 compares the effect of focus position on hole symmetry and quality using a direct laser drilling method and a sacrificial glass cover layer method as described herein.

Figure 24:
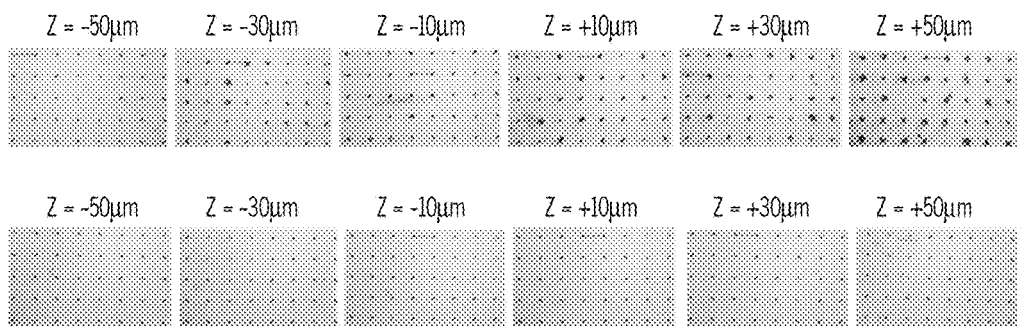
FIG. 24 shows top views of post-etch glass where holes were formed at different focus positions, wherein the top row shows post-etch glass where a sacrificial cover layer was not used, and the bottom row shows post-etch glass where a 50 μm thick sacrificial polymer cover layer was used according to one or more embodiments shown and described herein.

Sacrificial polymer cover layers in the form of 50 µm thick Lens Bond Type P-92 are applied by slot coating to a surface of glass articles made of 625 µm thick Eagle XG glass manufactured by Corning, Inc. The sacrificial polymer cover layers are UV cured by a single-pass Fusion UV system (254 mm, 23.622 W/mm UV-d lamp operated at 100% power) at 2.1336 meters per minute. A 355 nm nanosecond pulsed laser is used to form holes in glass article made of Eagle XG, manufactured by Corning, Inc. A direct laser drilling method as described in Comparative Example 1 and a laser drilling method using a sacrificial polymer cover layer as described in Example 4 is used. The focus position of the laser was adjusted from −50 µm, −30 µm, −10 µm, +10 µm, +30 µm, and +50 µm, where negative numbers indicate a focus location above the topmost glass surface and positive numbers indicate a focus location below the topmost glass surface. FIG. 24 shows the entrance holes of the glass articles before etching. The top row of photographs shows the glass articles prepared by direct laser drilling and the bottom row of photographs show the glass articles prepared using a sacrificial polymer cover layer. As seen in FIG. 24, the direct laser drilling method does not provide acceptable results at any of the evaluated focus locations. In contrast, a laser drilling method using a sacrificial glass cover layer as described herein provides acceptable results at nearly all focus locations.

Example 9

Example 9 shows the effect of retaining a 50 µm thick Lens Bond Type P-92 sacrificial polymer cover layer during an etching process following a sacrificial glass cover layer method as described herein.

A 50 µm thick sacrificial polymer cover layer in the form of Lens Bond Type P-92 is applied by slot coating to a surface of a glass article made of 500 µm thick Eagle XG glass manufactured by Corning, Inc. The sacrificial polymer cover layer is UV cured by a single-pass Fusion UV system (254 mm, 23.622 W/mm UV-d lamp operated at 100% power) at 2.1336 meters per minute. A 355 nm nanosecond pulsed laser operated as described above with respect to Example 4 is first used to form through holes in a sacrificial polymer cover layer. Subsequently, holes are formed in the glass article by pulsing the laser through the through holes formed in the sacrificial glass cover layer and onto a surface of the glass article. The sacrificial polymer cover layer and the glass article are submerged in HF etchant for approximately 6 minutes at 23° C. temperature. The sacrificial polymer cover layer is removed following the etching procedure without damaging the glass article. The diameter of the holes is about 30 µm on a top surface (i.e., surface having the sacrificial polymer cover layer) and about 15 µm on a bottom surface. FIG. 25 shows a top view (left) and a bottom view (right) of the glass article after etching and removal of the sacrificial polymer cover layer.

Example 10

Example 10 shows the effect of retaining a 50 µm thick UV-curable, HF-resistant sacrificial polymer cover layer during an etching process following a sacrificial glass cover layer method as described herein.

A 50 µm thick sacrificial polymer cover layer in the form of a UV-curable, HF-resistant, and strippable polymer material is applied by slot coating to a surface of a glass article made of 500 µm thick Eagle XG glass manufactured by Corning, Inc. The sacrificial polymer cover layer is UV cured by a single-pass Fusion UV system (254 mm, 23.622 W/mm UV-d lamp operated at 100% power) at 2.1336 meters per minute. A 355 nm nanosecond pulsed laser operated as described above with respect to Example 4 is first used to form through holes in a sacrificial polymer cover layer. Subsequently, holes are formed in the glass article by pulsing the laser through the through holes formed in the sacrificial glass cover layer and onto a surface of the glass article. The sacrificial polymer cover layer and the glass article are submerged in HF etchant for 3.5 minutes at 20° C. temperature. The sacrificial polymer cover layer is removed following the etching procedure without damaging the glass article. The diameter of the holes is about 30 μm on a top surface (i.e., surface having the sacrificial polymer cover layer) and about 21 μm on a bottom surface. FIG. 26 shows a top view (left) and a bottom view (right) of the glass article after etching and prior to removal of the sacrificial polymer cover layer.

Example 11

Example 11 shows the effect of retaining a 10 μm thick white and black pigment sacrificial cover layer during an etching process following a sacrificial glass cover layer method as described herein.

Figure 27A:
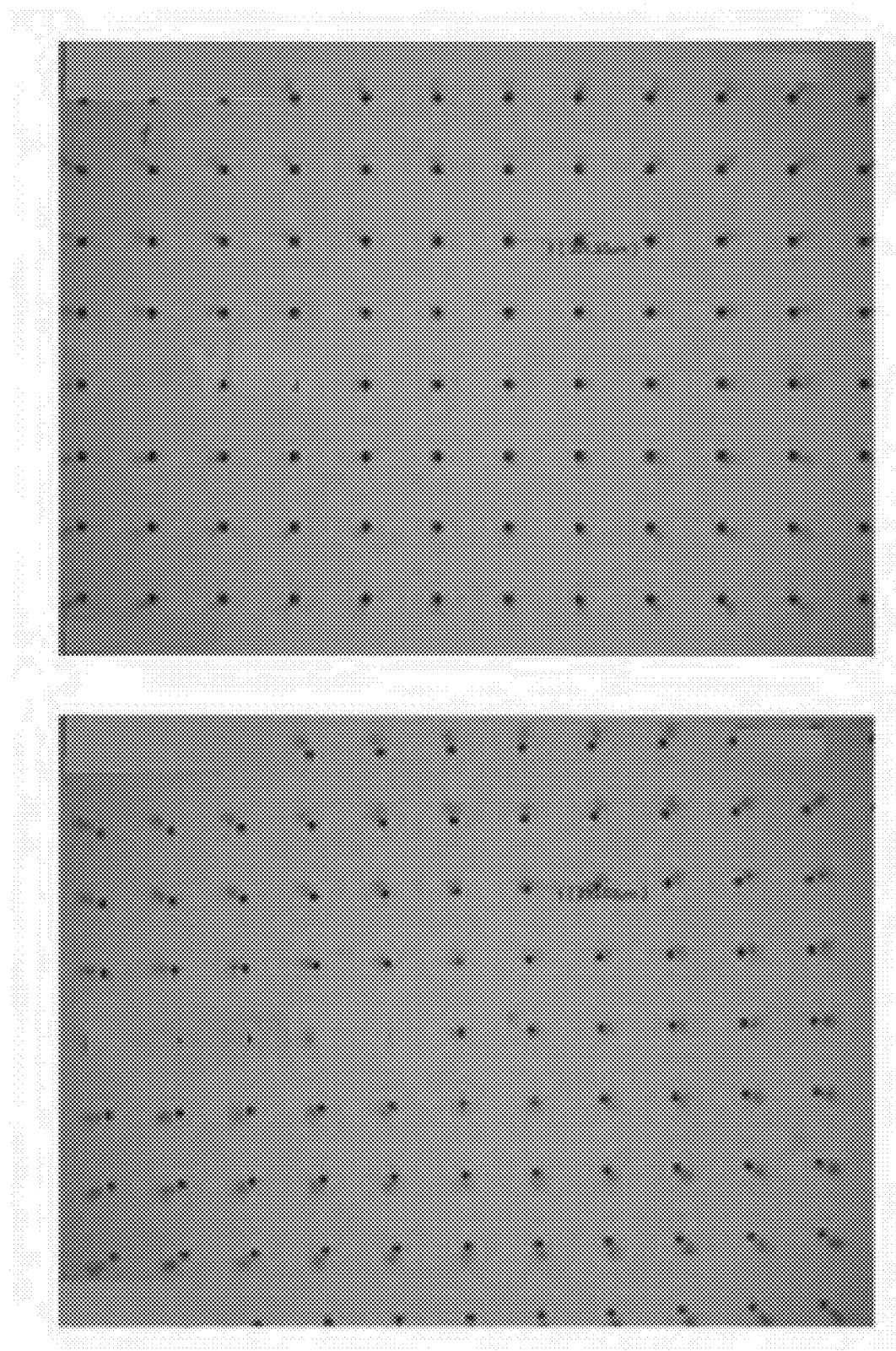
FIGS. 27A and 27B show top and bottom views of a glass substrate where black pigment and white pigment sacrificial cover layers were use, respectively, during the drilling process according to one or more embodiments shown and described herein.
Figure 27B:
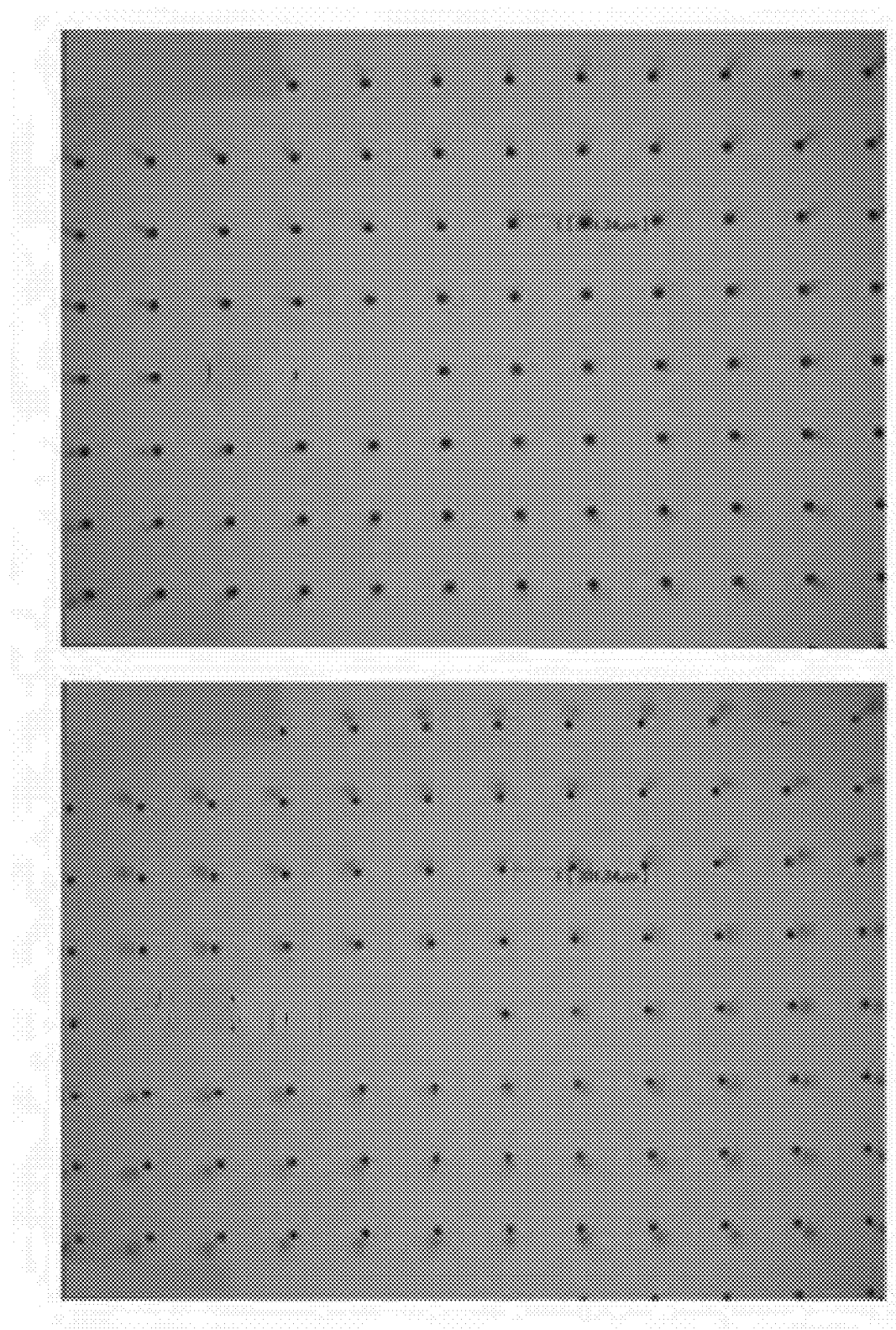

A 10 μm thick sacrificial cover layer in the form of white and black CRAYOLA Tempura paint was coated to a surface of a glass article made of 625 μm thick Eagle XG glass manufactured by Corning, Inc. The pigment sacrificial cover layer was spray coated to the surface of the glass article. A 355 nm nanosecond pulsed laser operated as described above with respect to Example 4 is first used to form through holes in the pigment sacrificial cover layer. Subsequently, holes are formed in the glass article by pulsing the laser through the through holes formed in the sacrificial cover layer and onto a surface of the glass article. The sacrificial cover layer and the glass article are submerged in HF etchant for 3.5 minutes at 20° C. temperature. The sacrificial cover layer is removed following the etching procedure without damaging the glass article. The diameter of the holes is about 30 μm on a top surface (i.e., surface having the sacrificial cover layer). FIG. 27A shows top (top image) and bottom (bottom image) views of the glass article made with a black pigment sacrificial cover layer after etching. FIG. 27B shows top (top image) and bottom (bottom image) views of the glass article made with a white pigment sacrificial cover layer after etching. As can be seen, in FIGS. 27A and 27B, the holes formed in the glass article are uniform and very little to no chipping is present.

Example 12

Example 12 shows the effect of retaining a black pigment sacrificial cover layer during an etching process following a sacrificial glass cover layer method as described herein.

Figure 28A:
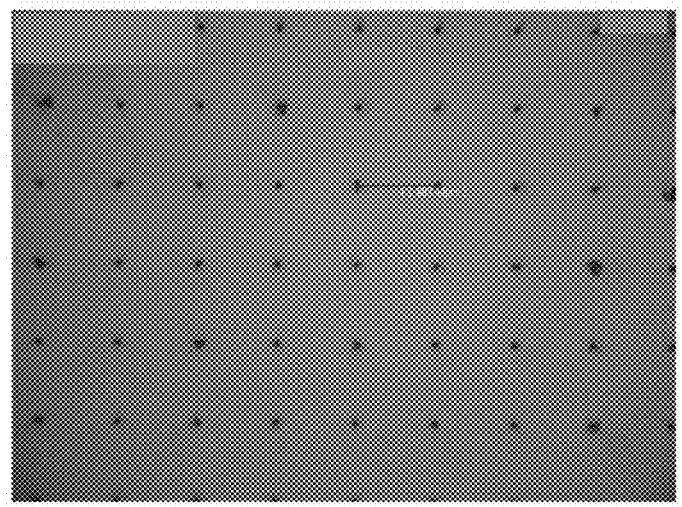
FIGS. 28A and 28B show top views of holes drilled into a glass substrate using direct drilling and drilling with a pigment sacrificial cover layer, respectively, according to one or more embodiments shown and described herein.
Figure 28B:
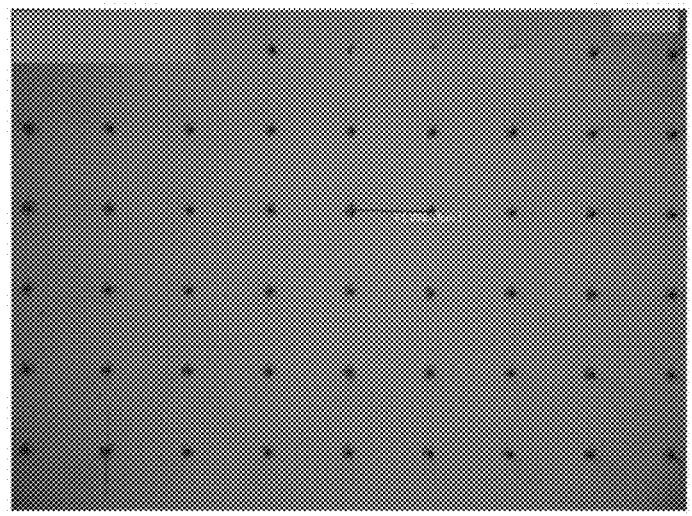

A sacrificial polymer cover layer in the form of black CARTER permanent marker was coated to a surface of a glass article made of 700 μm thick Eagle XG glass manufactured by Corning, Inc. The pigment sacrificial cover layer was manually applied to the surface of the glass article. A 355 nm nanosecond pulsed laser operated as described above with respect to Example 4 is first used to form through holes in the pigment sacrificial cover layer. Subsequently, holes are formed in the glass article by pulsing the laser through the through holes formed in the sacrificial cover layer and onto a surface of the glass article. The sacrificial cover layer was removed using an IPA wipe. The diameter of the holes is about 18 μm on a top surface (i.e., surface having the sacrificial cover layer). FIG. 28A shows a glass substrate with holes formed by direct drilling, and FIG. 28B shows a glass article with holes formed using the pigment sacrificial cover layer. As can be seen, in FIGS. 28A and 28B, the holes formed in the glass article using a pigment sacrificial cover layer are uniform and very little to no chipping is present.

Example 13

Example 13 shows the effect of retaining an acrylic enamel sacrificial cover layer during an etching process following a sacrificial glass cover layer method as described herein.

Figure 29A:
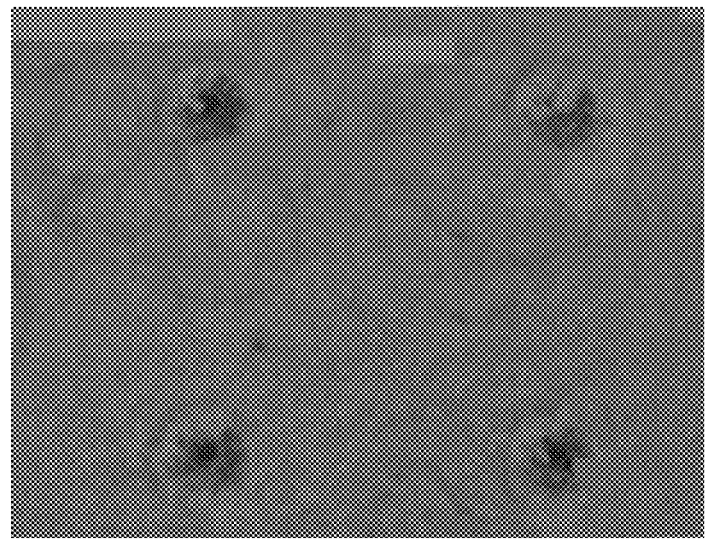
FIG. 29A shows a top view of a pre-etched glass substrate where a pigment sacrificial cover layer has been removed.
Figure 29B:
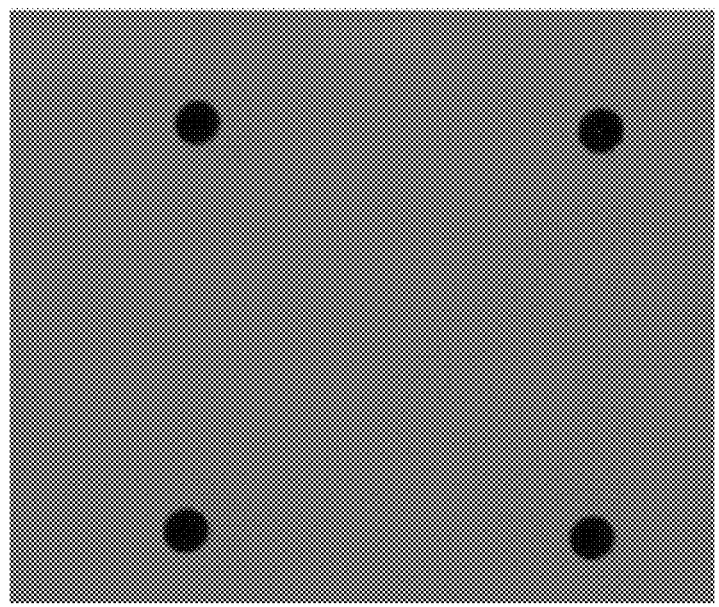
FIG. 29B shows a top view of a post-etched glass substrate where a pigment sacrificial cover layer has been removed.

A sacrificial polymer cover layer in the form of KRYLON TOUGH COAT acrylic enamel was coated to a surface of a glass article made of 300 μm thick Eagle XG glass manufactured by Corning, Inc. The sacrificial cover layer was spray coated to the surface of the glass article. A 355 nm nanosecond pulsed laser operated as described above with respect to Example 4 is first used to form through holes in the pigment sacrificial cover layer. Subsequently, holes are formed in the glass article by pulsing the laser through the through holes formed in the sacrificial cover layer and onto a surface of the glass article. The sacrificial cover layer was removed using an IPA wipe. Subsequently, the glass article was submerged in HF etchant for 3.5 minutes at 20° C. temperature. The diameter of the holes is about 18 μm on a top surface (i.e., surface having the sacrificial cover layer). FIG. 29A shows a glass article before etching and with the sacrificial cover layer removed, and FIG. 29B shows a glass article with holes formed after etching and with the sacrificial cover layer removed. As can be seen, in FIGS. 29A and 29B, the holes formed in the glass article using a pigment sacrificial cover layer are uniform and very little to no chipping is present.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for forming a plurality of precision holes in a glass substrate by drilling, the method comprising:
    affixing a sacrificial cover layer to a surface of the glass substrate;
    positioning a laser beam in a predetermined location relative to the glass substrate and corresponding to a desired location of one of the plurality of precision holes;
    forming a through hole in the sacrificial cover layer by repeatedly pulsing the laser beam at the predetermined location; and
    pulsing the laser beam into the through hole formed in the sacrificial cover layer at the predetermined location thereby creating the one of the plurality of precision holes, wherein a number of pulses applied to the glass substrate is determined by a desired depth of the one of the plurality of precision holes,
    wherein the sacrificial cover layer comprises glass and has a different composition than the glass substrate.

2. The method of claim 1, wherein the sacrificial cover layer is removed after the plurality of precision holes is formed in the glass substrate.

3. The method of claim 1, further comprising etching the glass substrate with an etching solution.

4. The method of claim 1, further comprising applying an electrically conductive material to one or more precision holes of the plurality of precision holes.

5. The method of claim 1, further comprising applying a fluid to at least one of the sacrificial cover layer and the surface of the glass substrate before attaching the sacrificial cover layer to the surface of the glass substrate.

6. The method of claim 1, wherein the sacrificial cover layer is affixed to the surface of the glass substrate by applying a liquid polymer material to the surface of the glass substrate.

7. The method of claim 6, further comprising removing the sacrificial cover layer from the surface of the glass substrate by applying a solvent to the sacrificial cover layer.

8. The method of claim 1, wherein the sacrificial cover layer is affixed to the surface of the glass substrate by applying a polymer tape to the surface of the glass substrate.

9. The method of claim 1, wherein the sacrificial cover layer is affixed to the surface of the glass substrate by Van der Waals attraction.

10. The method of claim 9, wherein a bonding energy provided by the Van der Waals attraction is between about 30 mJ/m$^2$ to about 100 mJ/m$^2$.

11. The method of claim 9, further comprising removing the sacrificial cover layer from the surface of the glass substrate by heating the sacrificial cover layer and the glass substrate such that the sacrificial cover layer separates from the glass substrate.

12. The method of claim 1, further comprising, after affixing the sacrificial cover layer to the glass substrate, positioning the sacrificial cover layer and the glass substrate into a carrier ring.

13. The method of claim 1, wherein the laser beam has a wavelength of about 355 nm, the laser beam is has a pulse width between about 5 ns and about 75 ns, the laser beam is pulsed at a repetition rate between about 1 kHz and about 30 kHz, and the laser beam has a pulse energy between about 25 µJ and about 175 µJ.

14. The method of claim 1, wherein the laser beam has a wavelength of about 355 nm, the laser beam has a numerical aperture between about 0.02 and about 0.4, and a focus position of the laser beam is within about 100 µm of a surface of the sacrificial cover layer.

* * * * *